(12) United States Patent
Kimura et al.

(10) Patent No.: US 10,896,733 B2
(45) Date of Patent: Jan. 19, 2021

(54) SEMICONDUCTOR MEMORY DEVICE AND METHOD OF CONTROLLING THE SAME

(71) Applicant: Toshiba Memory Corporation, Minato-ku (JP)

(72) Inventors: Keita Kimura, Fujisawa (JP); Hidehiro Shiga, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/562,750

(22) Filed: Sep. 6, 2019

(65) Prior Publication Data

US 2020/0294594 A1 Sep. 17, 2020

(30) Foreign Application Priority Data

Mar. 13, 2019 (JP) ................. 2019-046071

(51) Int. Cl.
| G11C 16/26 | (2006.01) |
| G11C 16/04 | (2006.01) |
| G11C 16/10 | (2006.01) |
| G11C 16/34 | (2006.01) |
| G11C 16/24 | (2006.01) |

(52) U.S. Cl.
CPC .......... *G11C 16/0483* (2013.01); *G11C 16/10* (2013.01); *G11C 16/24* (2013.01); *G11C 16/26* (2013.01); *G11C 16/3459* (2013.01)

(58) Field of Classification Search
CPC .................................................... G11C 16/10
USPC ..................................................... 365/185.18
See application file for complete search history.

(56) References Cited

U.S. PATENT DOCUMENTS

| 8,194,461 | B2 | 6/2012 | Kosaki et al. | |
| 9,396,775 | B2 | 7/2016 | Shirakawa et al. | |
| 9,613,704 | B2 | 4/2017 | Lee | |
| 2002/0064077 | A1* | 5/2002 | Kobayashi | G11C 5/145 |
| | | | | 365/226 |
| 2015/0255162 | A1* | 9/2015 | Shibazaki | G11C 5/06 |
| | | | | 365/185.05 |
| 2016/0196873 | A1* | 7/2016 | Noguchi | G11C 13/004 |
| | | | | 365/148 |
| 2018/0240515 | A1 | 8/2018 | Shibata et al. | |
| 2019/0371406 | A1* | 12/2019 | Yang | G11C 16/10 |

FOREIGN PATENT DOCUMENTS

| JP | 2015-176309 A | 10/2015 |
| JP | 2018-137006 A | 8/2018 |

\* cited by examiner

*Primary Examiner* — Min Huang
(74) *Attorney, Agent, or Firm* — Oblon, McClelland, Maier & Neustadt, L.L.P.

(57) ABSTRACT

A semiconductor memory device comprises: a memory transistor; a first wiring connected to a gate electrode of the memory transistor; and a control device that executes a read operation to read data of the memory transistor and a write operation to write data in the memory transistor. In the read operation or the write operation, the control device: increases a voltage of the first wiring to a first voltage from a first timing to a second timing; and adjusts a length from the first timing to the second timing corresponding to at least one of a voltage of the first wiring, a current of the first wiring, and an amount of charge flowed through the first wiring.

21 Claims, 24 Drawing Sheets

SEMICONDUCTOR MEMORY DEVICE AND METHOD OF CONTROLLING THE SAME

CROSS-REFERENCE TO RELATED APPLICATIONS

This application is based upon and claims the benefit of Japanese Patent Application No. 2019-046071, filed on Mar. 13, 2019, the entire contents of which are incorporated herein by reference.

BACKGROUND

Field

Embodiments described herein relate generally to a semiconductor memory device and method of controlling the same.

Description of the Related Art

There has been known a semiconductor memory device including a memory transistor and method of controlling the same.

DETAILED DESCRIPTION

Figure 1:
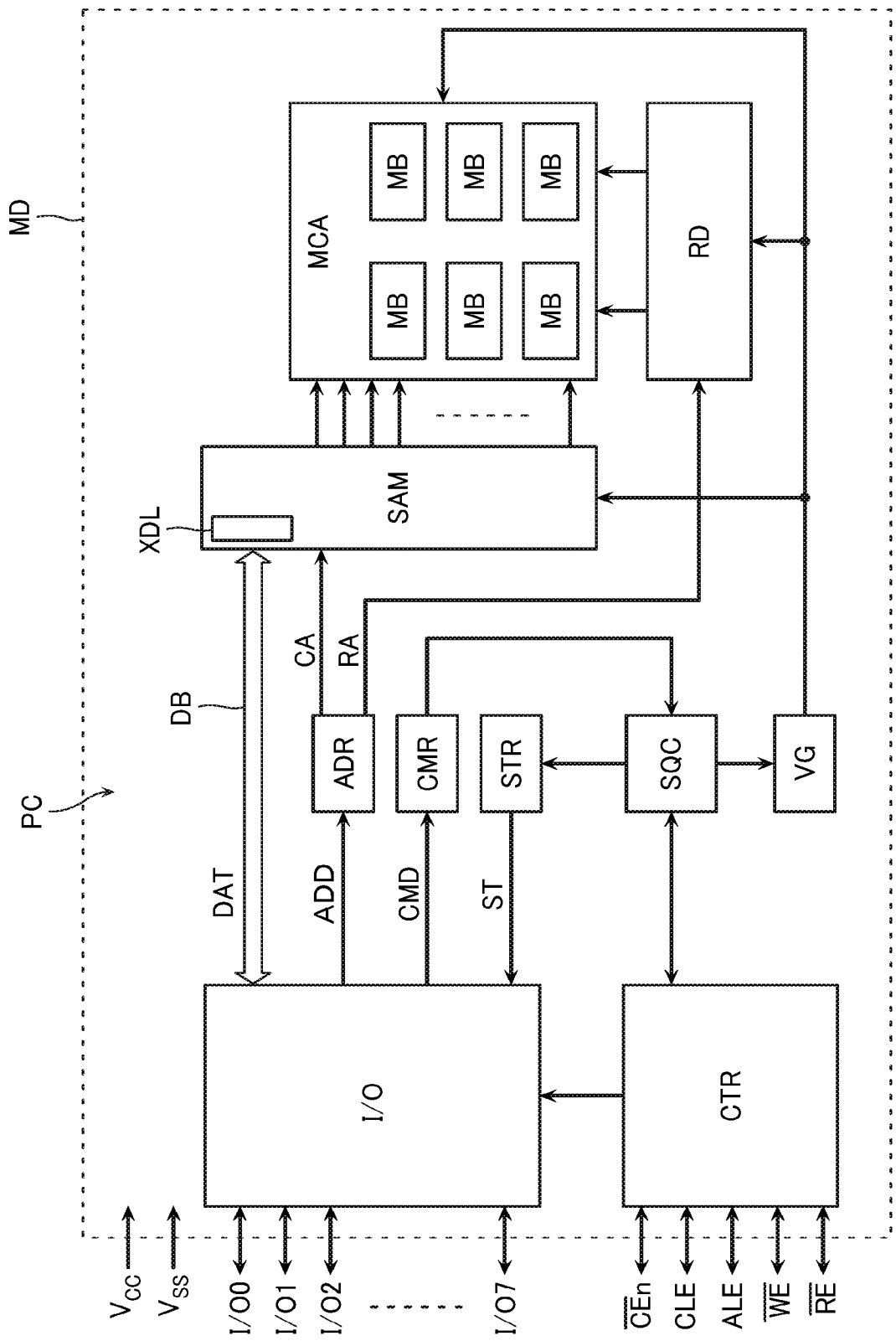
FIG. 1 is a schematic block diagram illustrating a configuration of a semiconductor memory device MD according to a first embodiment.

A semiconductor memory device according to one embodiment comprises: a memory transistor; a first wiring connected to a gate electrode of the memory transistor; and a control device that executes a read operation to read data of the memory transistor and a write operation to write data in the memory transistor. In the read operation or the write operation, the control device: increases a voltage of the first wiring to a first voltage from a first timing to a second timing; and adjusts a length from the first timing to the second timing corresponding to at least one of a voltage of the first wiring, a current of the first wiring, and an amount of charge flowed through the first wiring.

In a method of controlling a semiconductor memory device according to one embodiment, the semiconductor memory device comprises: a memory transistor; a first wiring connected to a gate electrode of the memory transistor; and a control device that executes a read operation to read data of the memory transistor and a write operation to write data in the memory transistor. In the read operation or the write operation, the control device: increases a voltage of the first wiring to a first voltage from a first timing to a second timing; and adjusts a length from the first timing to the second timing corresponding to at least one of a voltage of the first wiring, a current of the first wiring, and an amount of charge flowed through the first wiring.

The following describes semiconductor memory devices according to embodiments in detail with reference to the accompanying drawings. Here, the following embodiments are only examples, and are not described for the purpose of limiting the present invention.

In this description, when referring to "the semiconductor memory device", it may mean a memory die or may mean a memory system including a control die, such as a memory chip, a memory card, and an SSD. Further, it may mean a configuration including a host computer such as a smartphone, a tablet terminal, and a personal computer.

In this description, when referring to that a first configuration "is electrically connected" to a second configuration, the first configuration may be directly connected to the second configuration, or the first configuration may be connected to the second configuration via wiring, a semiconductor member, a transistor, or the like. For example, when three transistors are connected in series, even if the second transistor is in an OFF state, the first transistor is "electrically connected" to the third transistor.

In this description, when referring to that the first configuration "is connected between" the second configuration and a third configuration, it may mean that the first configuration, the second configuration, and the third configuration are connected in series and the first configuration is disposed on a current path between the second configuration and the third configuration.

In this description, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

First Embodiment

[Configuration]

Figure 2:
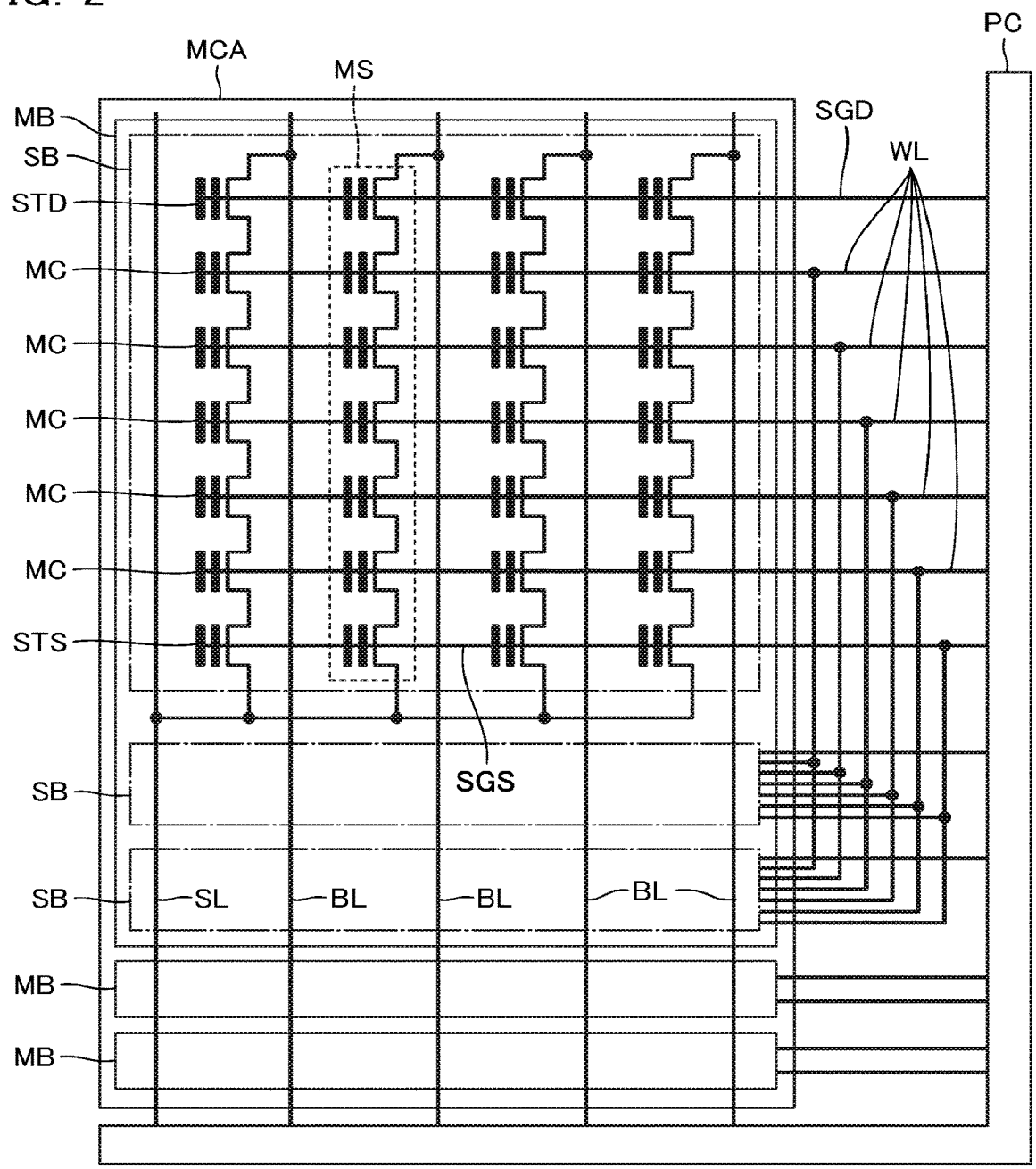
FIG. 2 is a schematic circuit diagram illustrating a configuration of a part of the semiconductor memory device MD.
Figure 3:
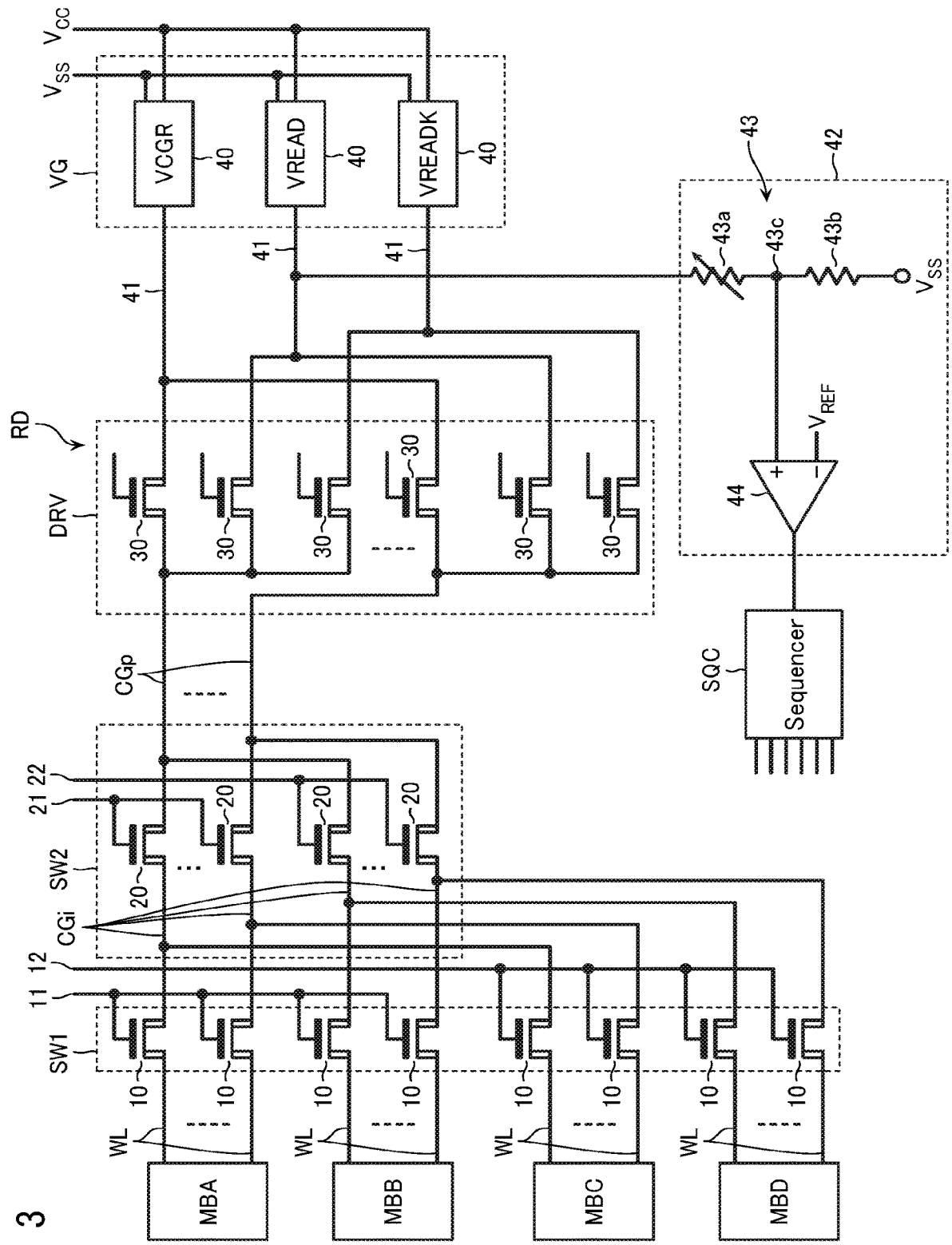
FIG. 3 is a schematic circuit diagram illustrating a configuration of a part of the semiconductor memory device MD.

FIG. 1 is a schematic block diagram illustrating a configuration of a semiconductor memory device MD according to a first embodiment. FIG. 2 and FIG. 3 are schematic circuit diagrams illustrating configurations of parts of the semiconductor memory device MD.

As illustrated in FIG. 1, the semiconductor memory device MD includes a memory cell array MCA that stores data and a peripheral circuit PC connected to the memory cell array MCA.

[Memory Cell Array MCA]

The memory cell array MCA includes a plurality of memory blocks MB. These plurality of memory blocks MB each include a plurality of subblocks SB as illustrated in FIG. 2. These plurality of subblocks SB each include a plurality of memory strings MS. These plurality of memory strings MS have one ends each connected to the peripheral circuit PC via a bit line BL. These plurality of memory strings MS have other ends each connected to the peripheral circuit PC via a common source line SL.

The memory string MS includes a drain select transistor STD, a plurality of memory cells MC, and a source select transistor STS, which are connected in series between the bit line BL and the source line SL. Hereinafter, the drain select transistor STD and the source select transistor STS may be simply referred to as select transistors (STD, STS).

The memory cell MC according to the embodiment is a field-effect type transistor (memory transistor) including a semiconductor layer that functions as a channel region, a gate insulating film including an electric charge accumulating film, and a gate electrode. The memory cell MC has a threshold voltage that varies corresponding to an amount of electric charge in the electric charge accumulating film. The memory cell MC stores data of one bit or a plurality of bits. The respective gate electrodes of the plurality of memory cells MC corresponding to one memory string MS are connected to word lines WL. These respective word lines WL are commonly connected to all the memory strings MS in one memory block MB.

The select transistor (STD, STS) is a field-effect type transistor including a semiconductor layer that functions as a channel region, a gate insulating film, and a gate electrode. The respective gate electrodes of the select transistors (STD, STS) are connected to select gate lines (SGD, SGS). The drain select line SGD is disposed corresponding to the subblock SB and commonly connected to all the memory strings MS in one subblock SB. The source select line SGS is commonly connected to the plurality of memory strings MS in one memory block MB.

[Peripheral Circuit PC]

As illustrated in FIG. 1, the peripheral circuit PC as a control device includes a sense amplifier module SAM, a row decoder RD, a voltage generation circuit VG, and a sequencer SQC. The peripheral circuit PC includes an address register ADR, a command register CMR, and a status register STR. The peripheral circuit PC includes an input/output control circuit I/O and a logic circuit CTR.

The sense amplifier module SAM includes a plurality of sense amplifier units corresponding to a plurality of bit lines BL. The sense amplifier units each include a sense amplifier connected to the bit line BL, a plurality of data latches, a logic circuit, and a data transfer line connected to these configurations. The sense amplifier includes a sense transistor that discharges or holds an electric charge of the data transfer line corresponding to a voltage or a current of the bit line BL. The data latch is used for data transfer, data operation, and the like. The sense amplifier module includes a decode circuit and a switch circuit (not illustrated). The decode circuit decodes a column address CA held in the address register ADR (FIG. 1). The switch circuit electrically conducts a data latch XDL corresponding to the column address CA with a bus DB, in accordance with an output signal of the decode circuit.

The row decoder RD includes, for example, a decode circuit that decodes a row address RA held in the address register ADR. As illustrated in FIG. 3, the row decoder RD includes, for example, a switch circuit SW1, a switch circuit SW2, and a driver circuit DRV. The switch circuit SW1 selectively electrically conducts a plurality of word lines WL with a plurality of wirings CGi. The switch circuit SW2 selectively electrically conducts the plurality of wirings CGi with a plurality of wirings CGp. The driver circuit DRV electrically conducts the plurality of wirings CGp with the voltage generation circuit VG.

The switch circuit SW1 includes a plurality of voltage transfer transistors 10. These plurality of voltage transfer transistors 10 are disposed corresponding to the plurality of word lines WL and the select gate lines (SGD, SGS) included in respective memory blocks MB and each connected to the corresponding word line WL or select gate line (SGD, SGS). In the example in the drawing, the gate electrodes of all the voltage transfer transistors 10 corresponding to memory blocks MBA and MBB are connected to a common wiring 11. Similarly, the gate electrodes of all the voltage transfer transistors 10 corresponding to memory blocks MBC and MBD are connected to a common wiring 12.

The wirings CGi are disposed corresponding to the plurality of word lines WL and the select gate lines (SGD, SGS) simultaneously selected at the switch circuit SW1.

The switch circuit SW2 includes a plurality of voltage transfer transistors 20. These plurality of voltage transfer transistors 20 are disposed corresponding to the plurality of wirings CGi and each connected to the corresponding wiring CGi. In the example in the drawing, the gate electrodes of all the voltage transfer transistors 20 corresponding to the memory blocks MBA and MBC are connected to a common wiring 21. Similarly, the gate electrodes of all the voltage transfer transistors 20 corresponding to the memory blocks MBB and MBD are connected to a common wiring 22.

The wirings CGp are disposed corresponding to the plurality of word lines WL and the select gate lines (SGD, SGS) included in one memory block MB.

The driver circuit DRV includes a plurality of voltage transfer transistors 30. These plurality of voltage transfer transistors 30 are disposed corresponding to the plurality of word lines WL and the select gate lines (SGD, SGS). The plurality of voltage transfer transistors 30 have one ends each connected to the wiring CGp. The plurality of voltage transfer transistors 30 have other ends each connected to a voltage supply line 41 of a charge pump circuit 40 included in the voltage generation circuit VG. The gate electrodes of the voltage transfer transistors 30 are each configured independently controllable.

The voltage generation circuit VG includes, for example, the charge pump circuit 40 connected to a power supply terminal ($V_{CC}$) and a grounding terminal ($V_{SS}$), and a step-down circuit (not illustrated). The voltage generation circuit VG generates a plurality of patterns of operating voltages supplied to the bit line BL, the source line SL, the word line WL, and the select gate lines (SGD, SGS) to simultaneously output the plurality of patterns of operating voltages from a plurality of voltage supply lines 41, in a read operation, a write operation, and an erase operation for the memory cell array MCA, in response to an internal control signal from the sequencer SQC.

At least one of the voltage supply lines 41 of the plurality of charge pump circuits 40 is connected to a voltage detecting circuit 42. The voltage detecting circuit 42 includes a voltage dividing circuit 43 connected to the voltage supply line 41 and a comparing circuit 44 connected to an output terminal of the voltage dividing circuit 43.

The voltage dividing circuit 43 includes a variable resistive element 43a and a resistive element 43b that are connected in series between the voltage supply line 41 and a grounding terminal ($V_{SS}$). The variable resistive element 43a has a resistance value adjustable with a parameter or the like. The variable resistive element 43a and the resistive element 43b are connected to an output terminal 43c. In the following description, it is assumed that the voltage dividing circuit 43 outputs a voltage obtained by multiplying a voltage of an input terminal by 1/k (k is a natural number) to the output terminal 43c.

The comparing circuit 44 has one input terminal connected to the output terminal of the voltage dividing circuit 43. The comparing circuit 44 has another input terminal supplied with a reference voltage $V_{REF}$. Its output terminal is connected to the sequencer SQC. In the example in the drawing, the reference voltage $V_{REF}$ is set lower than $1/k \, V_{READ}$.

The sequencer SQC (FIG. 1) sequentially decodes command data CMD held in the command register CMR to output the internal control signal to the row decoder RD, the sense amplifier module SAM, and the voltage generation circuit VG. The sequencer SQC outputs status data indicating its own state to the status register STR as necessary. For example, in executing the write operation or the erase operation, information indicative of whether the write operation or the erase operation has been normally ended or not is output as the status data.

The input/output control circuit I/O includes data input/output terminals I/O0 to I/O7, a shift register connected to these data input/output terminals I/O0 to I/O7, and a FIFO buffer connected to this shift register. The input/output control circuit I/O outputs data input from the data input/output terminals I/O0 to I/O7 to the data latch XDL in the sense amplifier module SAM, the address register ADR, or the command register CMR, in accordance with the internal control signal from the logic circuit CTR. The input/output control circuit I/O outputs data input from the data latch XDL or the status register STR to the data input/output terminals I/O0 to I/O7.

The logic circuit CTR receives an external control signal from a control die CD via external control terminals /CEn, CLE, ALE, /WE, and /RE to output the internal control signal to the input/output control circuit I/O in accordance with this.

[Exemplary Configuration]

Figure 4:
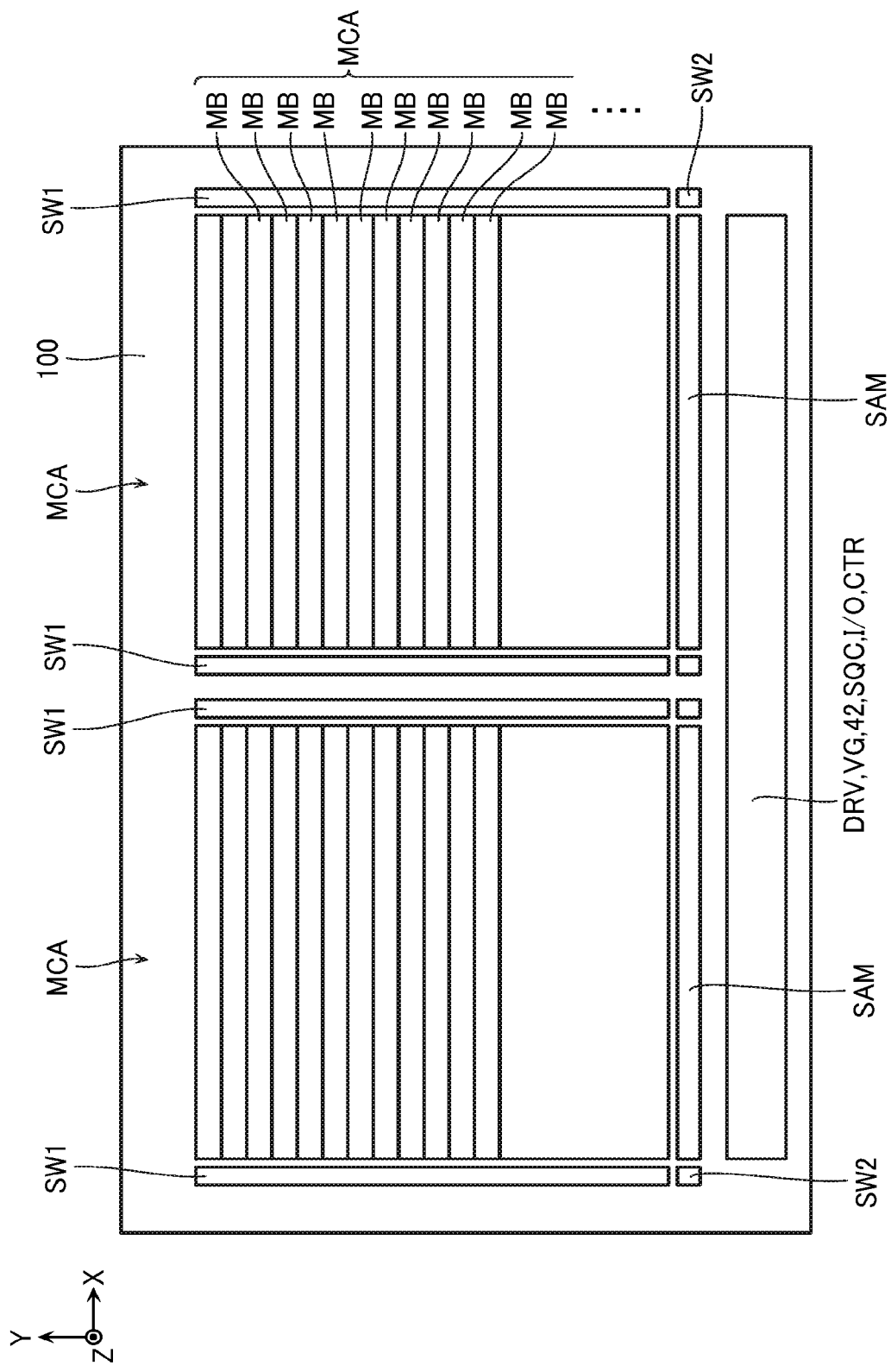
FIG. 4 is a schematic plan view illustrating the configuration of the semiconductor memory device MD.
Figure 5:
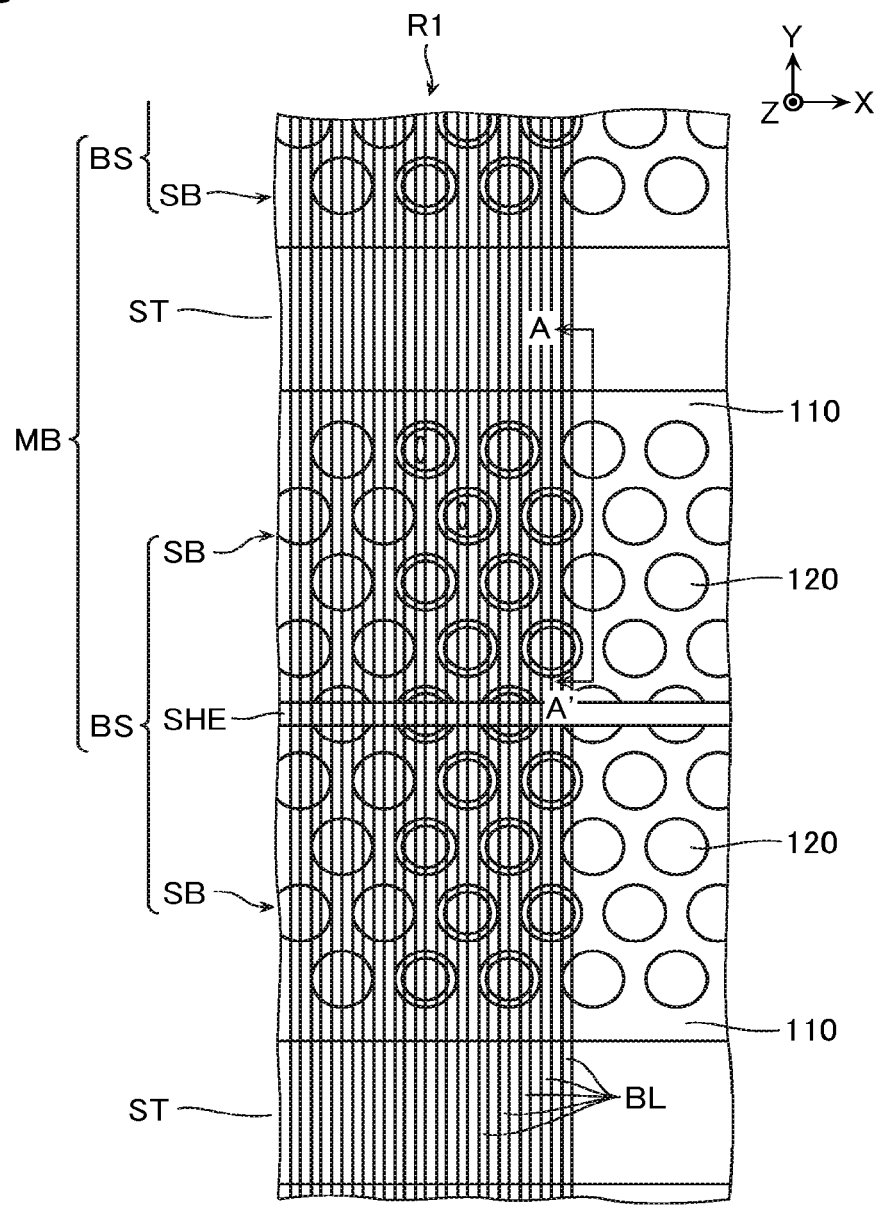
FIG. 5 is an enlarged view of a part of FIG. 4.
Figure 6:
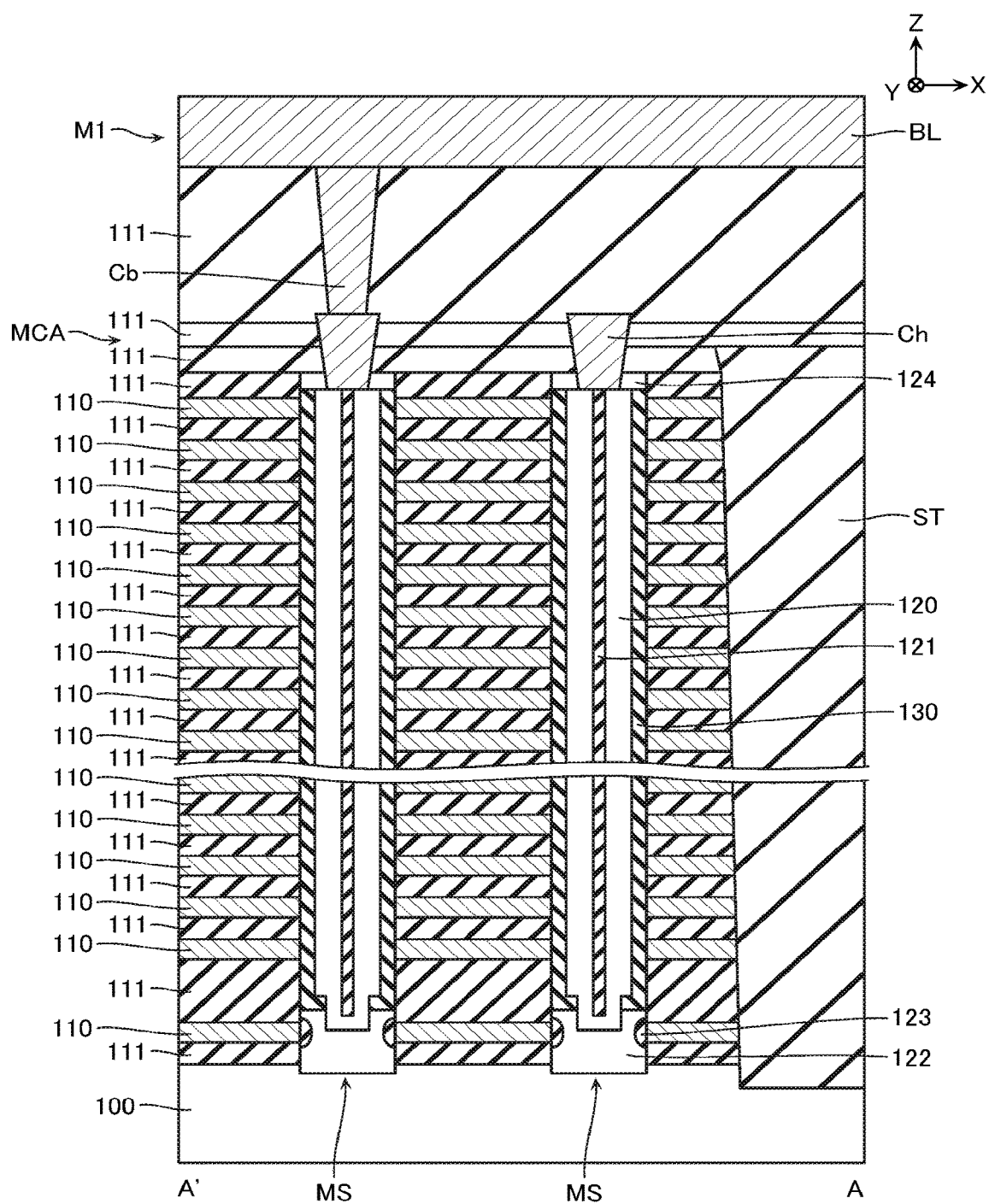
FIG. 6 is a cross-sectional view taken along a line A-A' of a structure illustrated in FIG. 5 viewed in an arrow direction.
Figure 7:
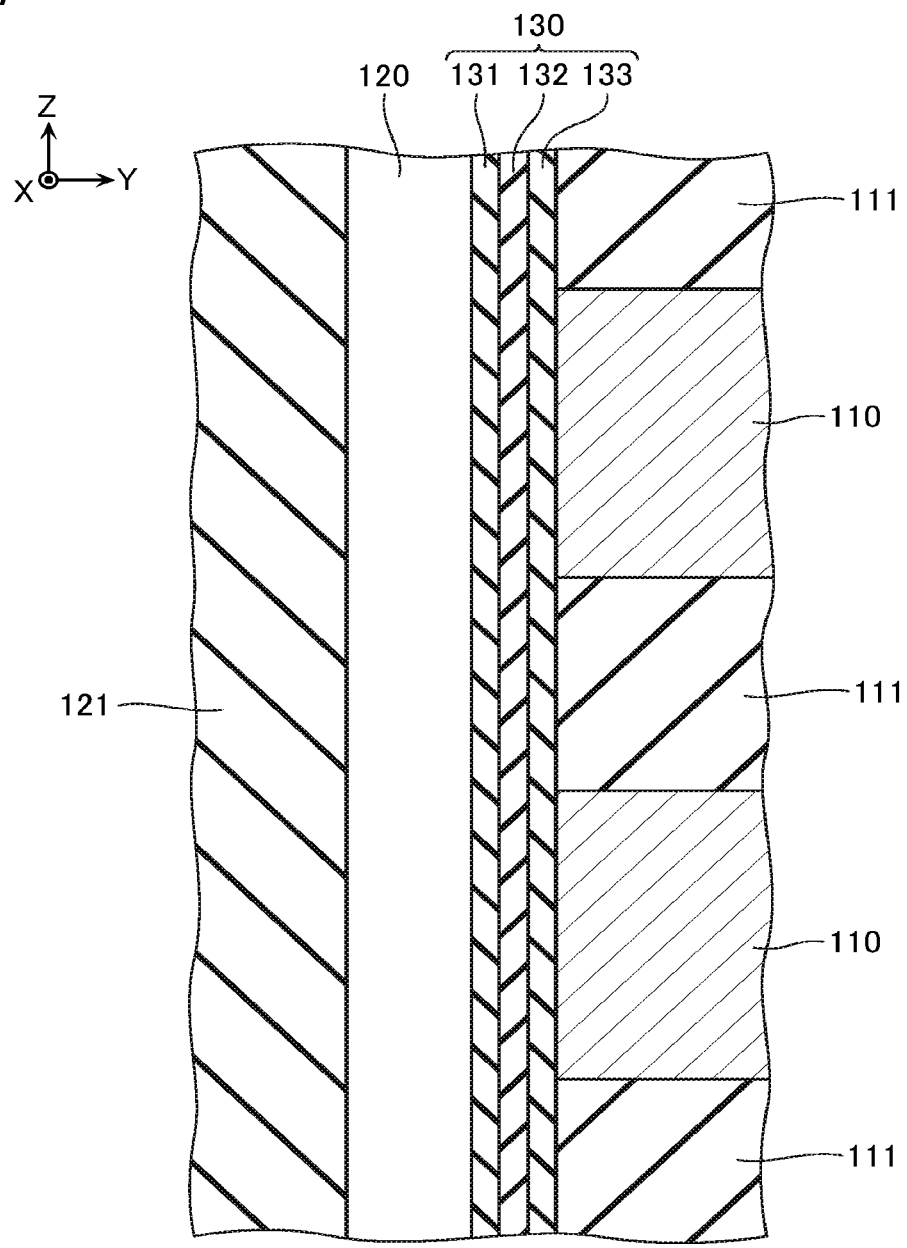
FIG. 7 is an enlarged view of a part of FIG. 6.

With reference to FIG. 4 to FIG. 7, the following describes an exemplary configuration of a semiconductor memory device according to the embodiment. FIG. 4 is a schematic plan view of the semiconductor memory device according to the embodiment. FIG. 5 is an enlarged view of a part of FIG. 4. FIG. 6 is a cross-sectional view taken along a line A-A' of a structure illustrated in FIG. 5 viewed in an arrow direction. FIG. 7 is an enlarged view of a part of FIG. 6. FIG. 4 to FIG. 7 illustrate a schematic configuration. A specific configuration is changeable as necessary. In FIG. 4 to FIG. 7, a part of the configuration is omitted.

As illustrated in FIG. 4, the semiconductor memory device according to the embodiment includes a semiconductor substrate 100. In the example in drawing, the semiconductor substrate 100 includes two memory cell arrays MCA arranged in an X direction. Regions extending in a Y direction along both end portions in the X direction of the memory cell arrays MCA include the switch circuits SW1 (FIG. 3) in the row decoder RD. Although not illustrated in the drawing, the above-described wirings CGi are disposed in these regions. These wirings CGi extend in the Y direction along these regions. Regions extending in the X direction along end portions in the Y direction of the memory cell arrays MCA includes the sense amplifier modules SAM. Regions near both end portions in the X direction of the regions where the sense amplifier modules SAM are disposed include the switch circuits SW2 (FIG. 3) in the row decoder RD. A region outside these regions includes the driver circuit DRV, the voltage generation circuit VG, the voltage detecting circuit 42, the sequencer SQC, the input/output control circuit I/O, and the logic circuit CTR.

The memory cell array MCA includes a plurality of memory blocks MB arranged in the Y direction. The memory block MB includes two block structures BS arranged in the Y direction as illustrated in FIG. 5. An inter-block insulating layer ST extending in the X direction is disposed between the two block structures BS that are adjacent in the Y direction.

The block structure BS includes two subblocks SB arranged in the Y direction and an inter-subblock insulating layer SHE disposed between these two subblocks SB.

The subblock SB, as exemplified in FIG. 6, includes a plurality of conducting layers 110 disposed above the semiconductor substrate 100, a plurality of semiconductor layers 120, and a plurality of gate insulating films 130 each disposed between the plurality of conducting layers 110 and the plurality of semiconductor layers 120.

The semiconductor substrate 100 is, for example, a semiconductor substrate of single-crystal silicon (Si) or the like containing P-type impurities. An N-type well containing N-type impurities such as phosphorus (P) is disposed on a part of a surface of the semiconductor substrate 100. A P-type well containing P-type impurities such as boron (B) is disposed on a part of a surface of the N-type well.

The conducting layer 110 is an approximately plate-shaped conducting layer extending in the X direction. The plurality of conducting layers 110 are arranged in a Z direction. The conducting layer 110, for example, may include a laminated film or the like of titanium nitride (TiN) and tungsten (W) or may include polycrystalline silicon or the like containing impurities of phosphorus, boron, or the like. An insulating layer 111 of silicon oxide (SiO$_2$) or the like is disposed between the conducting layers 110.

Among the plurality of conducting layers 110, one or a plurality of conducting layers 110 positioned at the bottom function as the source select line SGS (FIG. 2) and the gate electrodes of the plurality of source select transistors STS connected to this source select line SGS. A plurality of conducting layers 110 positioned above this function as the word line WL (FIG. 2) and the gate electrodes of the plurality of memory cells MC (FIG. 2) connected to this word line WL. One or a plurality of conducting layers 110 positioned above this function as the drain select line SGD and the gate electrodes of the plurality of drain select transistors STD (FIG. 2) connected to this drain select line SGD.

The plurality of semiconductor layers 120 are arranged in the X direction and the Y direction as exemplified in FIG. 5. The semiconductor layer 120 is, for example, a semiconductor film of non-doped polycrystalline silicon (Si) or the like. The semiconductor layer 120 has, for example, as exemplified in FIG. 6, an approximately cylindrical shape and includes an insulating film 121 of silicon oxide or the like at a center part. Respective outer peripheral surfaces of the semiconductor layers 120 are surrounded by the conducting layers 110. The semiconductor layer 120 has a lower end portion connected to the P-type well of the semiconductor substrate 100 via a semiconductor layer 122 of non-doped single-crystal silicon or the like. The semiconductor layer 122 is opposed to the conducting layer 110 via an insulating layer 123 of silicon oxide or the like. The semiconductor layer 120 has an upper end portion connected to the bit line BL via a semiconductor layer 124 containing N-type impurities of phosphorus (P) or the like and contacts Ch and Cb. The semiconductor layer 120 each function as a channel region of the plurality of memory cells MC and the drain select transistor STD included in one memory string MS (FIG. 2). The semiconductor layer 122 functions as a channel region of a part of the source select transistor STS.

The gate insulating film 130 includes, for example, as illustrated in FIG. 7, a tunnel insulating film 131, an electric charge accumulating film 132, and a block insulating film 133, which are laminated between the semiconductor layer 120 and the conducting layer 110. The tunnel insulating film 131 and the block insulating film 133 are, for example, insulating films of silicon oxide or the like. The electric charge accumulating film 132 is, for example, a film configured to accumulate the electric charge of silicon nitride (SiN) or the like. The tunnel insulating film 131, the electric charge accumulating film 132, and the block insulating film 133, which have approximately cylindrical shapes, extend in the Z direction along the outer peripheral surface of the semiconductor layer 120.

FIG. 7 illustrates an example that the gate insulating film 130 includes the electric charge accumulating film 132 of silicon nitride or the like. However, the gate insulating film 130 may include, for example, a floating gate of polycrystalline silicon or the like containing N-type or P-type impurities.

[Read Operation]

Figure 8:
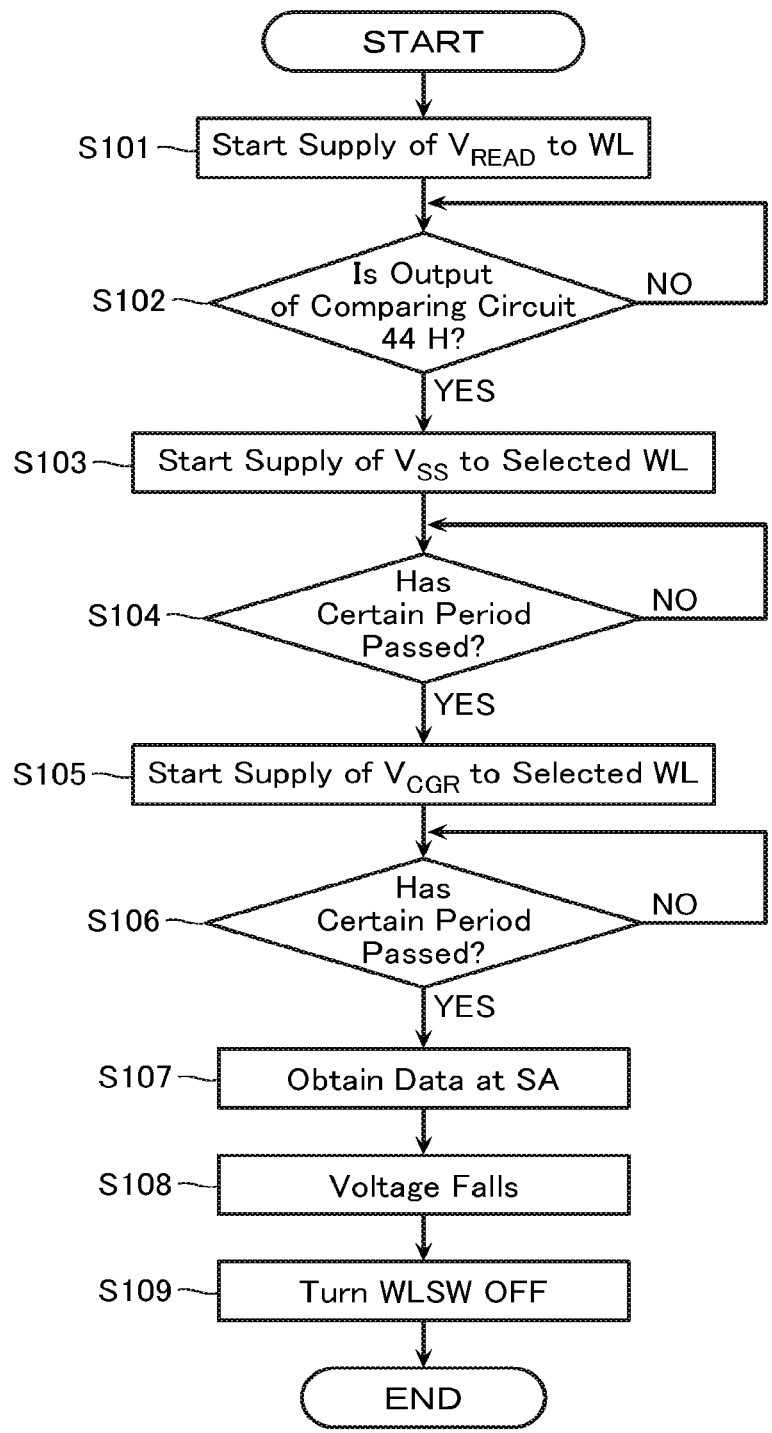
FIG. 8 is a schematic flowchart for describing a read operation according to the first embodiment.
Figure 9:
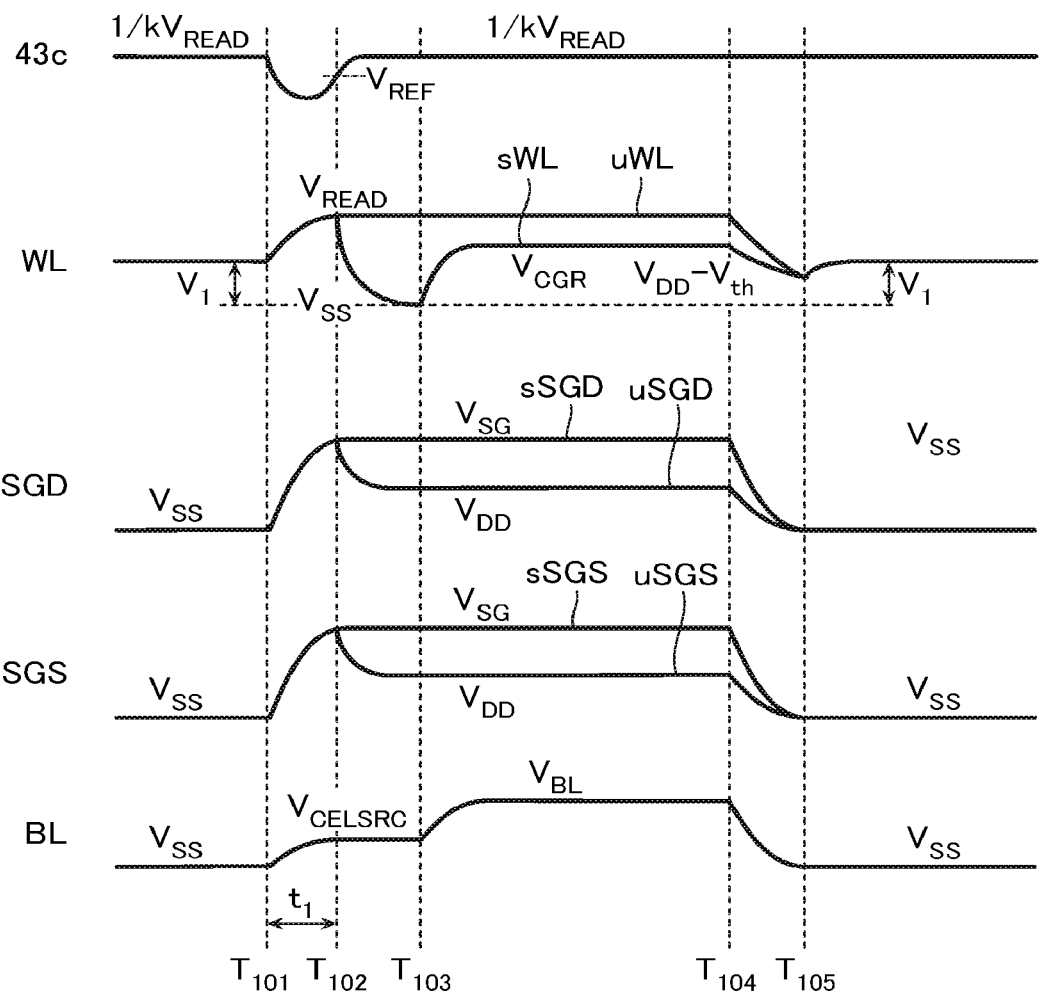
FIG. 9 is a schematic timing diagram for describing the read operation.
Figure 10:
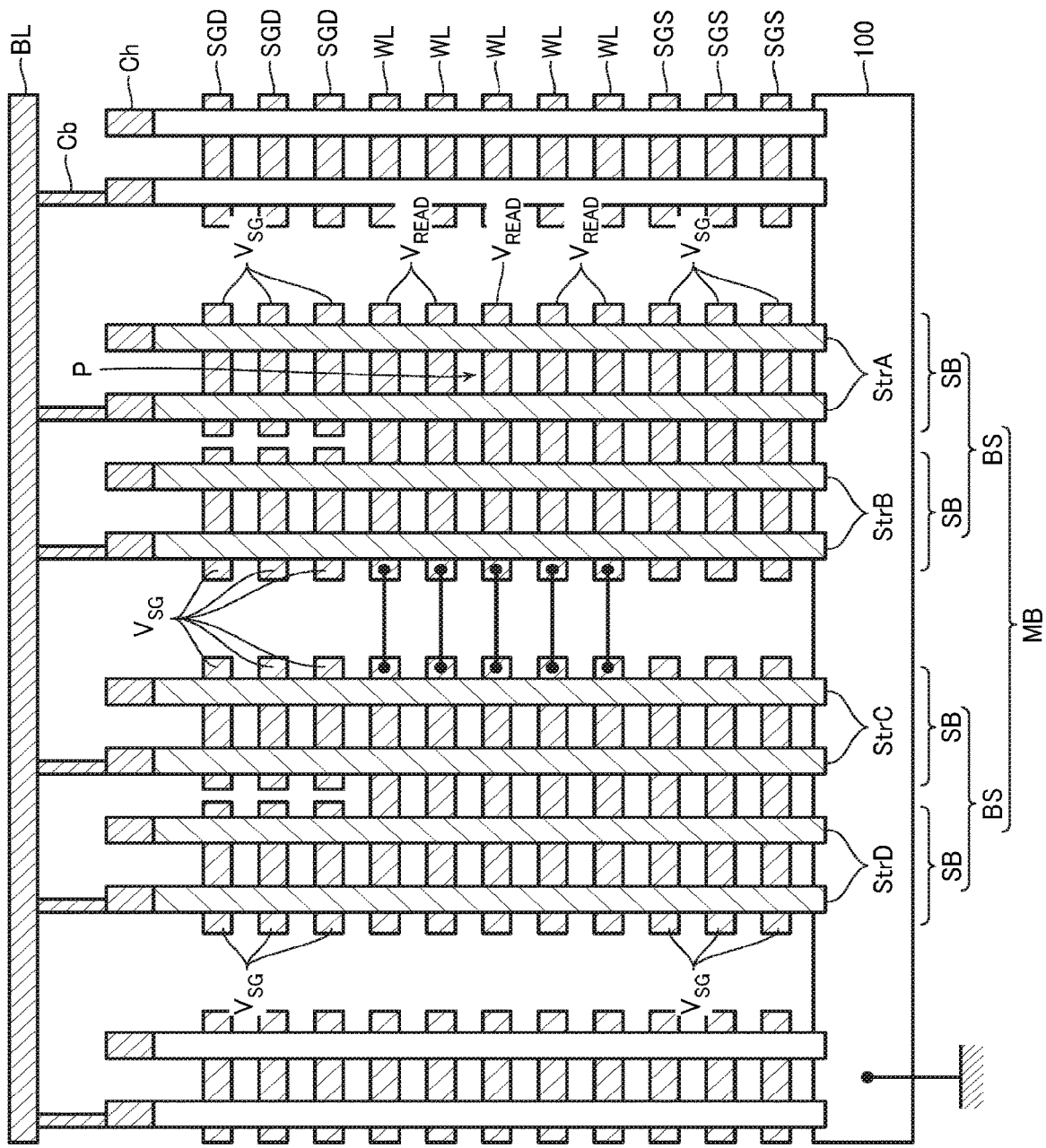
FIG. 10 is a schematic cross-sectional view for describing the read operation.
Figure 11:
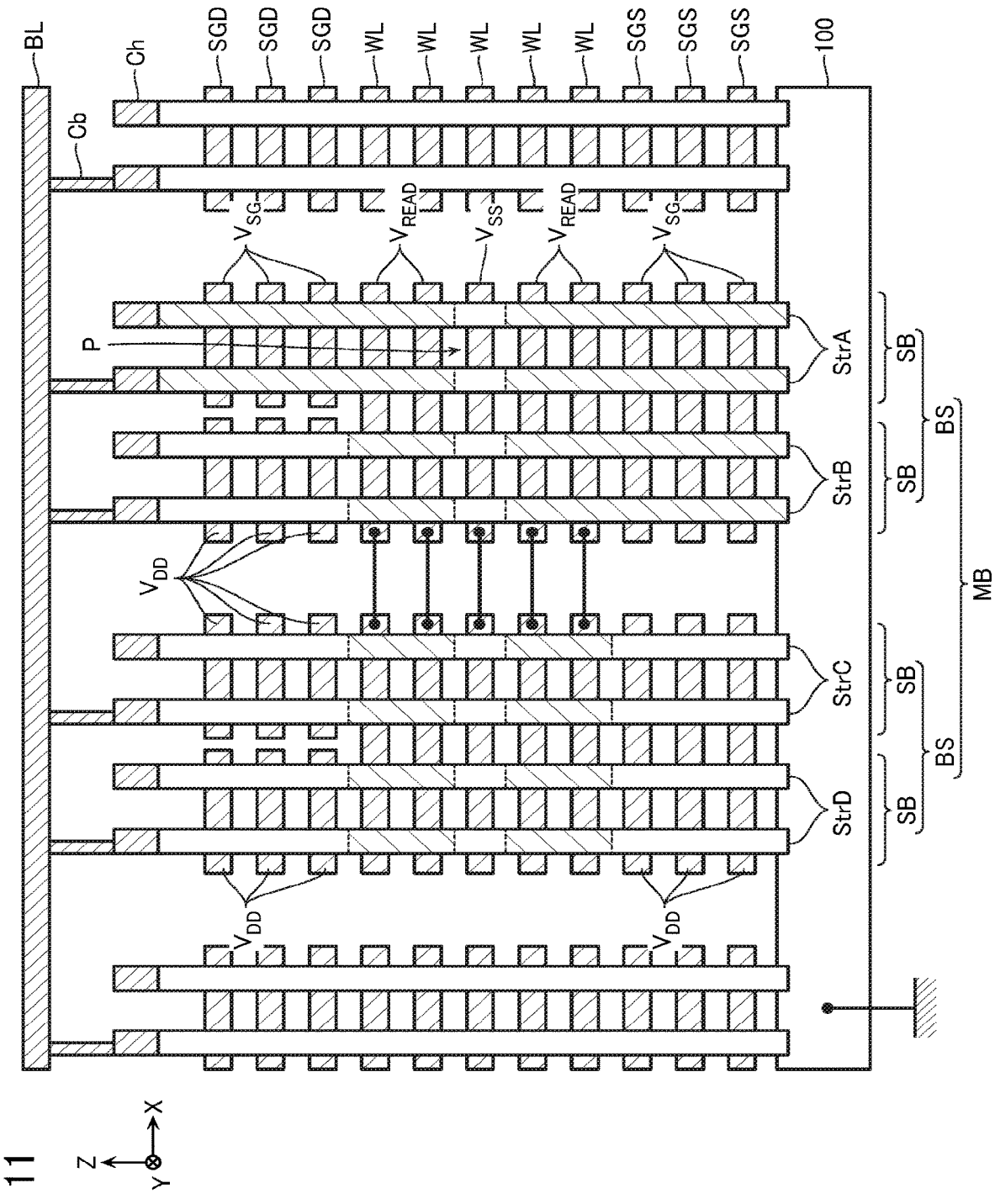
FIG. 11 is a schematic cross-sectional view for describing the read operation.
Figure 12:
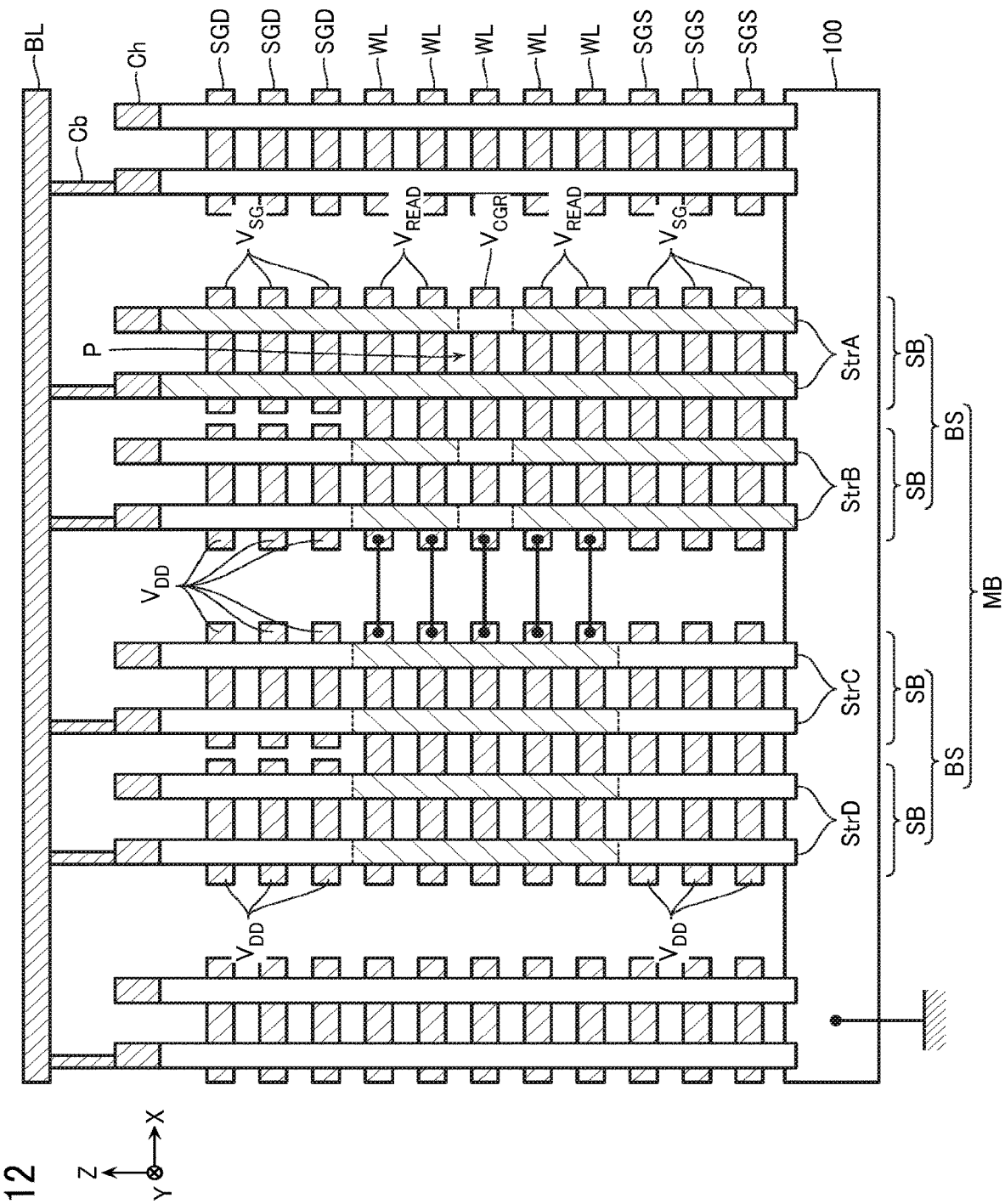
FIG. 12 is a schematic cross-sectional view for describing the read operation.

With reference to FIG. 8 to FIG. 12, the following describes a read operation of the semiconductor memory device according to the embodiment. FIG. 8 is a schematic flowchart for describing the read operation of the semiconductor memory device according to the embodiment. FIG. 9 is a schematic timing diagram for describing the read operation. FIG. 10 to FIG. 12 are schematic cross-sectional views for describing the read operation.

FIG. 9 illustrates a voltage of the output terminal 43c of the voltage dividing circuit 43 described with reference to FIG. 3, a voltage of the word line WL, a voltage of the drain select line SGD, a voltage of the source select line SGS, and a voltage of the bit line BL.

In the example in FIG. 10 to FIG. 12, the memory block MB includes four subblocks SB. Hereinafter, the respective memory strings MS (FIG. 2) included in these four subblocks SB may be referred to as a string StrA, a string StrB, a string StrC, and a string StrD.

In the following example, a description will be given of an example that the read operation is executed on a selected page P corresponding to the string StrA. The word line WL connected to the selected page P may be referred to as a selected word line sWL, and other word lines WL may be referred to as non-selected word lines uWL. The drain select line SGD connected to the string StrA may be referred to as a selected drain select line sSGD, and the drain select lines SGD connected the strings StrB, StrC, and StrD may be referred to as non-selected drain select lines uSGD. The source select lines SGS connected to the strings StrA and StrB may be referred to as selected source select lines sSGS, and the source select lines SGS connected to the strings StrC and StrD may be referred to as non-selected source select lines uSGS.

In Step S101 (FIG. 8), supply of the voltage to the word line WL and the like is started. For example, at a timing T$_{101}$ in FIG. 9, the word line WL is supplied with a voltage V$_{READ}$, the select gate line (SGD, SGS) is supplied with a voltage V$_{SG}$, and the bit line BL is supplied with a voltage V$_{CELSRC}$. The voltage V$_{READ}$ has a magnitude to the extent that the memory cell MC turns ON regardless of data stored in the memory cell MC. The voltage V$_{SG}$ has a magnitude to the extent that the select transistor (STD, STS) turns ON. The voltage V$_{CELSRC}$ may be comparable with a ground voltage V$_{SS}$.

At this time, the word line WL is supplied with the electric charge of the voltage supply line 41 of the charge pump circuit 40 that supplies the voltage V$_{READ}$, thus temporarily decreasing the voltage of the voltage supply line 41. In association with this, for example, as illustrated in FIG. 9, the voltage of the output terminal 43c of the voltage detecting circuit 42 connected to the voltage supply line 41 also temporarily decreases.

In Step S102, it is determined whether an output voltage of the comparing circuit 44 (FIG. 3) is "H" or not. When the output voltage of the comparing circuit 44 is not "H", the operation proceeds to Step S102. When the output voltage of the comparing circuit 44 is "H", the operation proceeds to Step S103.

At this time, the charge pump circuit 40 supplies the voltage supply line 41 with a positive electric charge, and the voltage of the word line WL and the voltage supply line 41 gradually approaches the voltage V$_{READ}$. For example, as exemplified in FIG. 10, this makes the whole of the memory strings MS in the memory block MB including the selected memory cell MC turn ON to cause all the memory cells MC to electrically conduct with the bit line BL and the source line SL. The voltage of the output terminal 43c of the voltage dividing circuit 43 also approaches 1/k V$_{READ}$ and becomes larger than the reference voltage V$_{REF}$ at a certain timing, thus causing the output voltage of the comparing circuit 44 (FIG. 3) to be "H". At this time, the voltages of the selected word line sWL and the non-selected word line uWL are V$_{READ}$.

In Step S103 (FIG. 8), supply of the voltage to the selected word line sWL and the like is started. For example, at a timing $T_{102}$ in FIG. 9, the selected word line sWL is supplied with the ground voltage $V_{SS}$, and the non-selected select gate line (uSGD, uSGS) is supplied with a voltage $V_{DD}$. The voltage $V_{DD}$ has, for example, a magnitude to the extent that the select gate line (SGD, SGS) turns OFF. In association with this, for example, as illustrated in FIG. 9, the voltage of the non-selected word line uWL is maintained at around the voltage $V_{READ}$, and the voltage of the selected word line sWL starts decreasing toward the ground voltage $V_{SS}$. The voltage of the non-selected select gate line (uSGD, uSGS) starts decreasing toward the voltage $V_{DD}$, and the voltage of the selected select gate line (sSGD, sSGS) is maintained at around the voltage $V_{SG}$.

In Step S104, with reference to a timer (not illustrated) or the like, it is determined whether a predetermined period has passed from the execution of Step S103 or not. When the predetermined period has not passed, the operation proceeds to Step S104. When the predetermined period has passed, the operation proceeds to Step S105.

For example, as exemplified in FIG. 11, this separates the memory cells MC included in the strings StrB, StrC, and StrD from the bit line BL. The memory cells MC included in the strings StrC and StrD are separated from the source line SL. All the memory cells MC connected to the selected word line sWL turn OFF.

In Step S105 (FIG. 8), supply of the voltage to the selected word line sWL and the like is started. For example, at a timing $T_{103}$ in FIG. 9, the selected word line sWL is supplied with a read voltage $V_{CGR}$, and the bit line BL is supplied with a read bit line voltage $V_{BL}$. The read voltage $V_{CGR}$ has a magnitude to the extent that the memory cell MC turns ON or OFF corresponding to the data stored in the memory cell MC.

In Step S106, with reference to the timer (not illustrated) or the like, it is determined whether a predetermined period has passed from the execution of Step S105 or not. When the predetermined period has not passed, the operation proceeds to Step S106. When the predetermined period has passed, the operation proceeds to Step S107.

For example, as exemplified in FIG. 12, this causes a state where the current flows through the bit line BL corresponding to the data stored in the selected memory cell MC.

In Step S107 (FIG. 8), the sense amplifier detects the current or the voltage of the bit line BL.

In Step S108, for example, at a timing $T_{104}$ in FIG. 9, the voltages of the word line WL, the select gate line (SGD, SGS), and the bit line BL fall. For example, the voltage of the word line WL falls to around $V_{DD}-V_{th}$, and the voltages of the select gate line (SGD, SGS) and the bit line BL fall to around the ground voltage $V_{SS}$. $V_{th}$ is, for example, a threshold voltage of a voltage transfer transistor having the largest threshold voltage among the plurality of voltage transfer transistors connected between the voltage supply line 41 (FIG. 3) and the word line WL. At the timing $T_{104}$, the voltages of the word line WL and the select gate line (SGD, SGS) approximately simultaneously fall. Thus, the semiconductor layer 120 is electrically separated from the bit line BL and the source line SL, and the electrons remain in the semiconductor layer 120. The voltage of the semiconductor layer 120 becomes a negative voltage by capacitive coupling with the word line WL.

In Step S109 (FIG. 8), for example, at a timing $T_{105}$ in FIG. 9, the switch circuits SW1 and SW2 (FIG. 3) and the like are turned OFF. From the timing $T_{105}$, the electric charge that has remained in the semiconductor layer 120 gradually moves to the bit line BL and the source line SL via the select transistors (STD, STS), thus gradually increasing the voltage of the semiconductor layer 120. In association with this, the voltage of the word line WL increases to around a voltage $V_1$ by the capacitive coupling with the semiconductor layer 120. Hereinafter, such a phenomenon may be referred to as "creeping-up".

COMPARATIVE EXAMPLE

Figure 13:
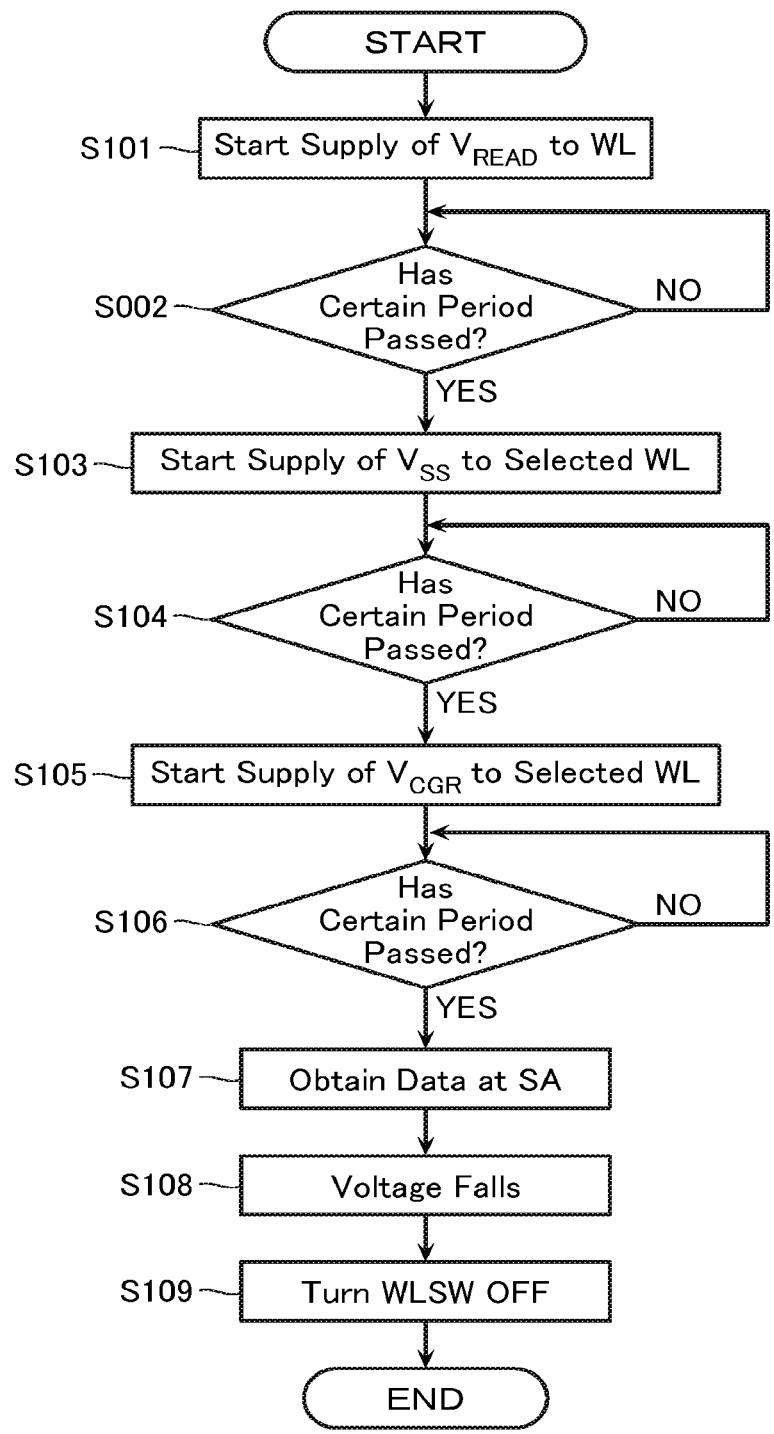
FIG. 13 is a schematic flowchart for describing a read operation according to a comparative example.
Figure 14:
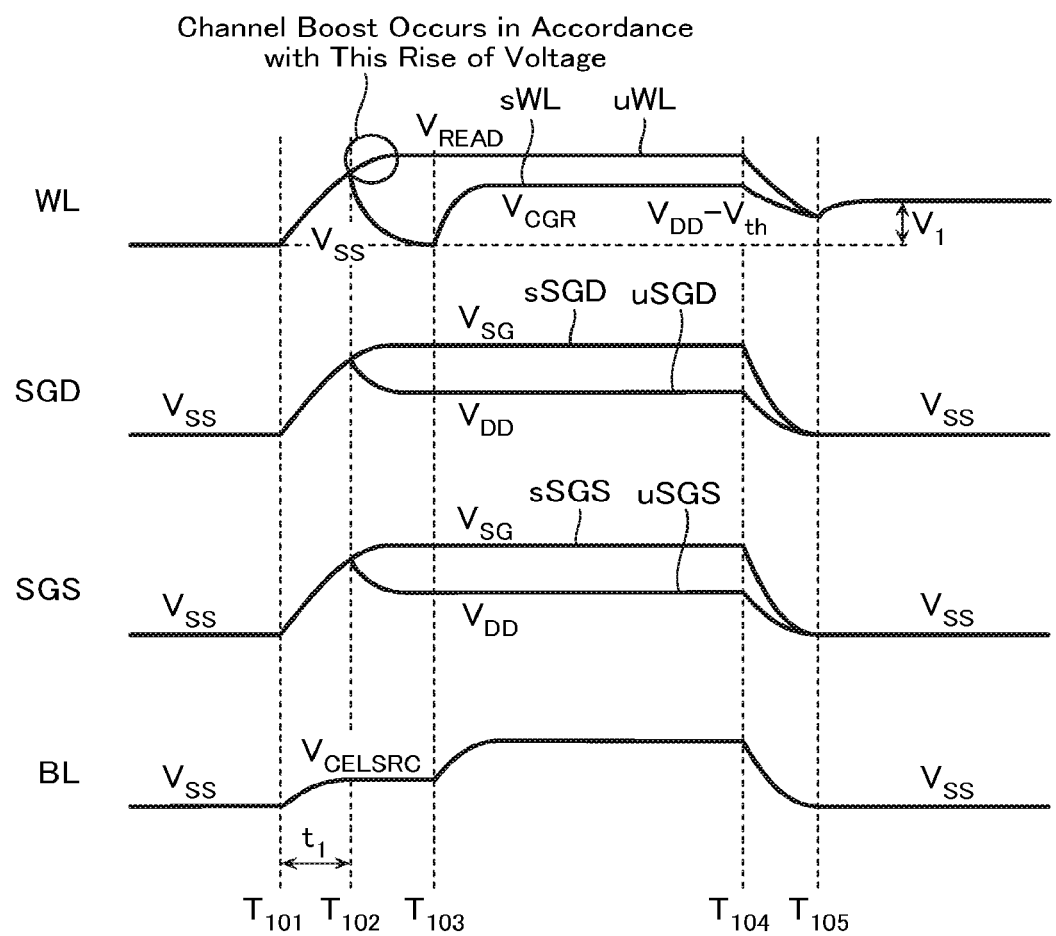
FIG. 14 is a schematic timing diagram for describing the read operation.
Figure 15:
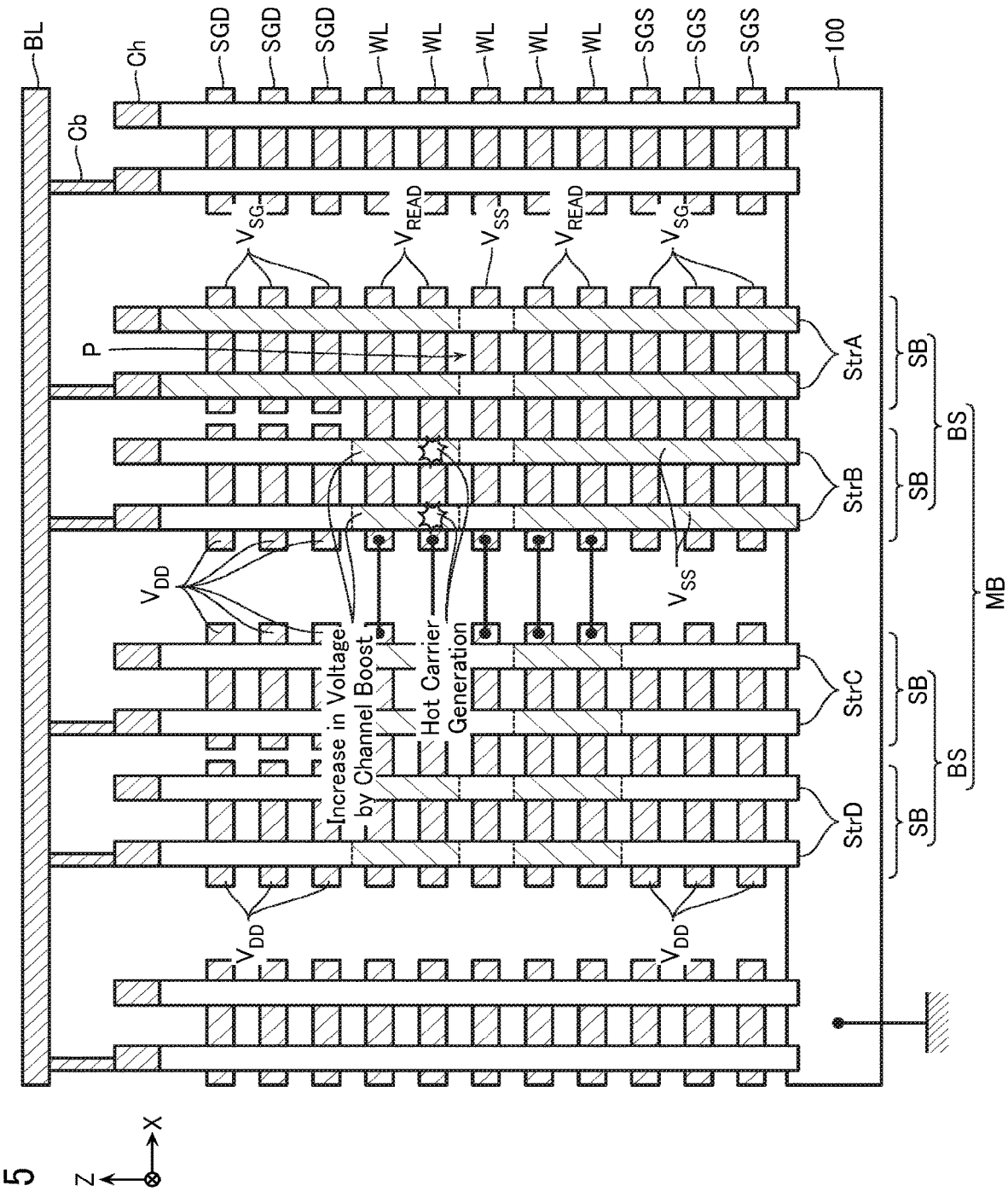
FIG. 15 is a schematic cross-sectional view for describing the read operation.
Figure 16:
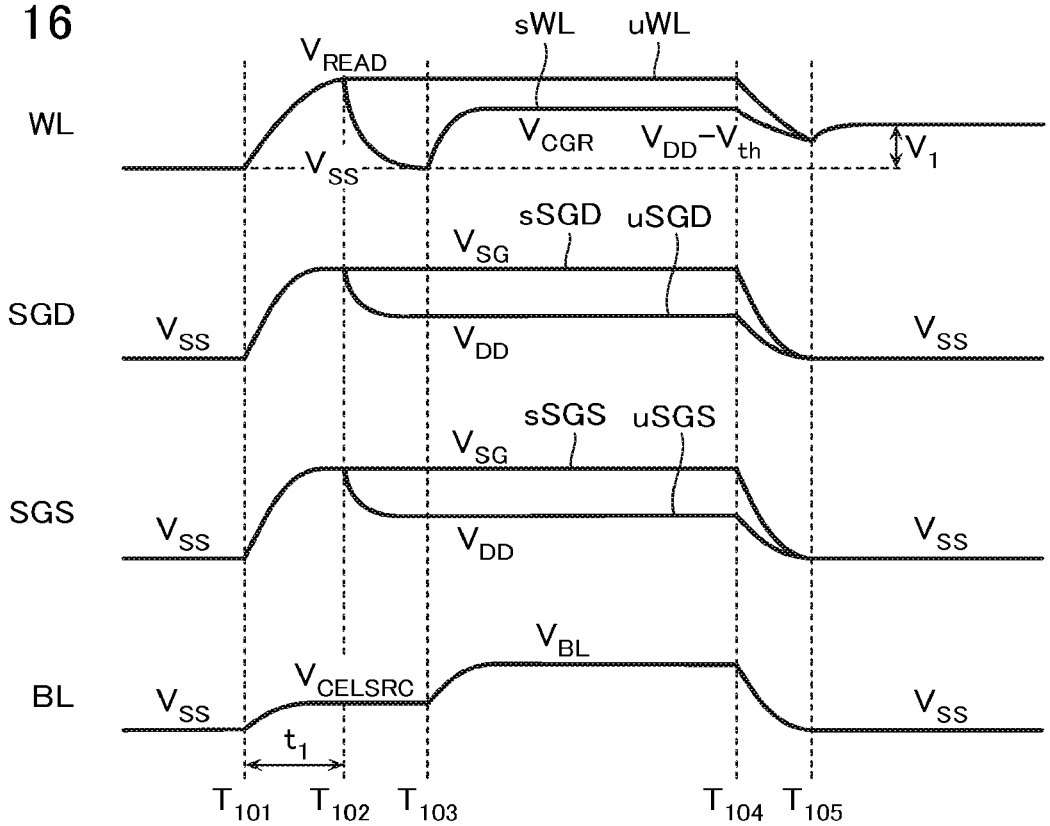
FIG. 16 is a schematic timing diagram for describing the read operation.
Figure 17:
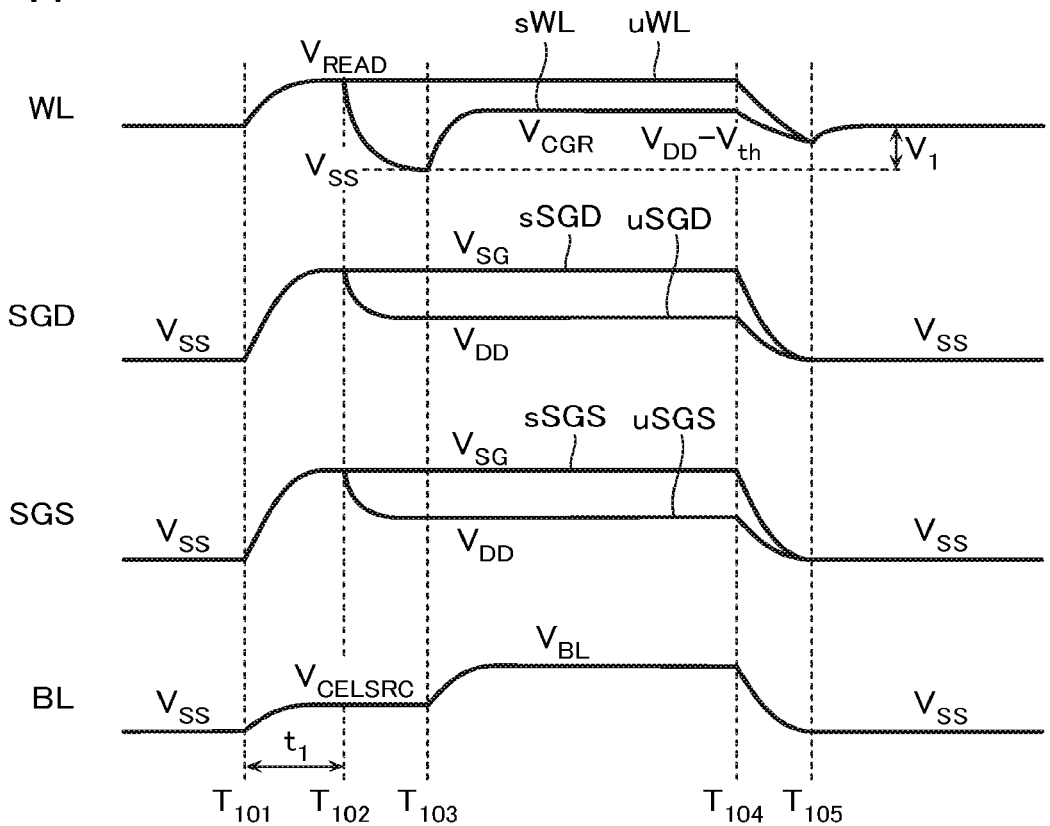
FIG. 17 is a schematic timing diagram for describing the read operation.

With reference to FIG. 13 to FIG. 17, the following describes a semiconductor memory device and a read operation according to a comparative example. FIG. 13 is a schematic flowchart for describing the read operation according to the comparative example. FIG. 14, FIG. 16, and FIG. 17 are schematic timing diagrams for describing the read operation. FIG. 15 is a schematic cross-sectional view for describing the read operation.

The semiconductor memory device according to the comparative example does not include the voltage detecting circuit 42 as exemplified in FIG. 3. As illustrated in FIG. 13, in Step S002 of the read operation according to the comparative example, with reference to the timer (not illustrated) or the like, it is determined whether a predetermined period has passed from the execution of Step S101 or not.

Here, when a waiting period in Step S002 of the read operation is set with the timer or the like, for example, as illustrated in FIG. 14, awaiting period $t_1$ from the timing $T_{101}$ to the timing $T_{102}$ will be a fixation period. As a result, as illustrated in the drawing, before the voltage of the word line WL reaches the read pass voltage $V_{READ}$, the operation at the timing $T_{102}$ may be started. This case will be described.

At the timing $T_{102}$, as illustrated in FIG. 14, the voltage of the selected source select line sSGS (the source select line SGS connected to the source select transistors STS of the strings StrA and StrB) heads for $V_{SG}$. Thus, as illustrated in FIG. 15, the strings StrA and StrB electrically conduct with the source line SL.

At the timing $T_{102}$, as illustrated in FIG. 14, the voltage of the selected drain select line sSGD (the drain select line SGD connected to the drain select transistor STD of the string StrA) heads for $V_{SG}$. Thus, as illustrated in FIG. 15, the selected string StrA electrically conduct with the bit line BL.

At the timing $T_{102}$, as illustrated in FIG. 14, the voltage of the non-selected drain select line uSGD connected to the drain select transistor STD of the string StrB heads for $V_{DD}$. Thus, as illustrated in FIG. 15, the string StrB is electrically separated from the bit line BL.

At the timing $T_{102}$, as illustrated in FIG. 14, the voltage of the non-selected source select line uSGS (the source select line SGS connected to the source select transistors STS of the strings StrC and StrD) heads for $V_{DD}$. Thus, as illustrated in FIG. 15, the strings StrC and StrD are electrically separated from the source line SL.

At the timing $T_{102}$, as illustrated in FIG. 14, the voltages of the non-selected drain select lines uSGD connected to the drain select transistors STD of the strings StrC and StrD heads for $V_{DD}$. Thus, as illustrated in FIG. 15, the strings StrC and StrD are electrically separated from the bit line BL.

Here, for the string StrB, the memory cells MC at a drain side with respect to the selected word line sWL is electrically separated from the bit line BL before the voltage of the non-selected word line uWL becomes $V_{READ}$.

At the timing $T_{102}$, as illustrated in FIG. 14, the selected word line sWL heads for $V_{SS}$. Thus, the memory cell MC connected to the selected word line sWL turns OFF. At this time, a channel of the memory cell MC at the drain side with respect to the memory cell MC connected to the selected word line sWL of the string StrB is in a floating state. Accordingly, when the non-selected word line uWL on the drain side with respect to the selected word line sWL is attempted to increase to $V_{READ}$, the channel boosts to increase the electric potential.

Meanwhile, the memory cell MC at a source side with respect to the memory cell MC connected to the selected word line sWL has a channel having the electric potential equal to the electric potential (the ground voltage $V_{SS}$) of the source line SL. Accordingly, even when the non-selected word line uWL at the source side with respect to the selected word line sWL increases to $V_{READ}$, the boost of the channel does not occur.

As described above, at the string StrB, a potential difference occurs across the memory cell MC connected to the selected word line sWL. Thus, as illustrated in FIG. 15, the hot electrons occur. These hot electrons may be injected into the electric charge accumulating film 132 (FIG. 7) of the non-selected memory cell MC positioned at the drain side of the memory cell MC connected to the selected word line sWL, thus increasing the threshold voltage of the non-selected memory cell MC.

At the strings StrC and StrD, the above-described problem is less likely to occur. This is because the string is electrically separated from the source line SL and the bit line BL, and thus, even if the channel boosts, the potential difference does not occur across the memory cell MC connected to the selected word line sWL as the string StrB.

Such a phenomenon is preventable by making the waiting period $t_1$ from the timing $T_{101}$ to the timing $T_{102}$ sufficiently long, for example, as illustrated in FIG. 16. This is because, before the string is separated from the bit line BL and the source line SL and turns into the floating state, the voltage of the word line WL has increased to $V_{READ}$, and thus, the channel boost does not occur.

However, for example, as illustrated in FIG. 17, as in a case where the word line WL has creeped up, there is a condition that the waiting period $t_1$ requires less time. Thus, it is not preferred from an aspect of speed-up of the operation to set the waiting period $t_1$ long in every read operation.

Effect

In the read operation according to the embodiment, as described with reference to FIG. 8 and the like, after the supply of the voltage is started in Step S101, waiting until the output voltage of the comparing circuit 44 (FIG. 3) becomes "H" in Step S102, afterwards, the supply of the next voltage is started in Step S103. Such a method allows the waiting period $t_1$ (FIG. 9) from the timing $T_{101}$ to the timing $T_{102}$ to be shortened to a minimum necessary length. For example, it is possible that the waiting period $t_1$ is shortened under the condition that the waiting period $t_1$ may be short as exemplified in FIG. 9 and the waiting period $t_1$ is lengthened under the condition that it is preferred that the waiting period $t_1$ is relatively long as exemplified in FIG. 18A. This can provide the semiconductor memory device that operates at high speed without damaging a reliability.

Modification of First Embodiment

Figure 18A:
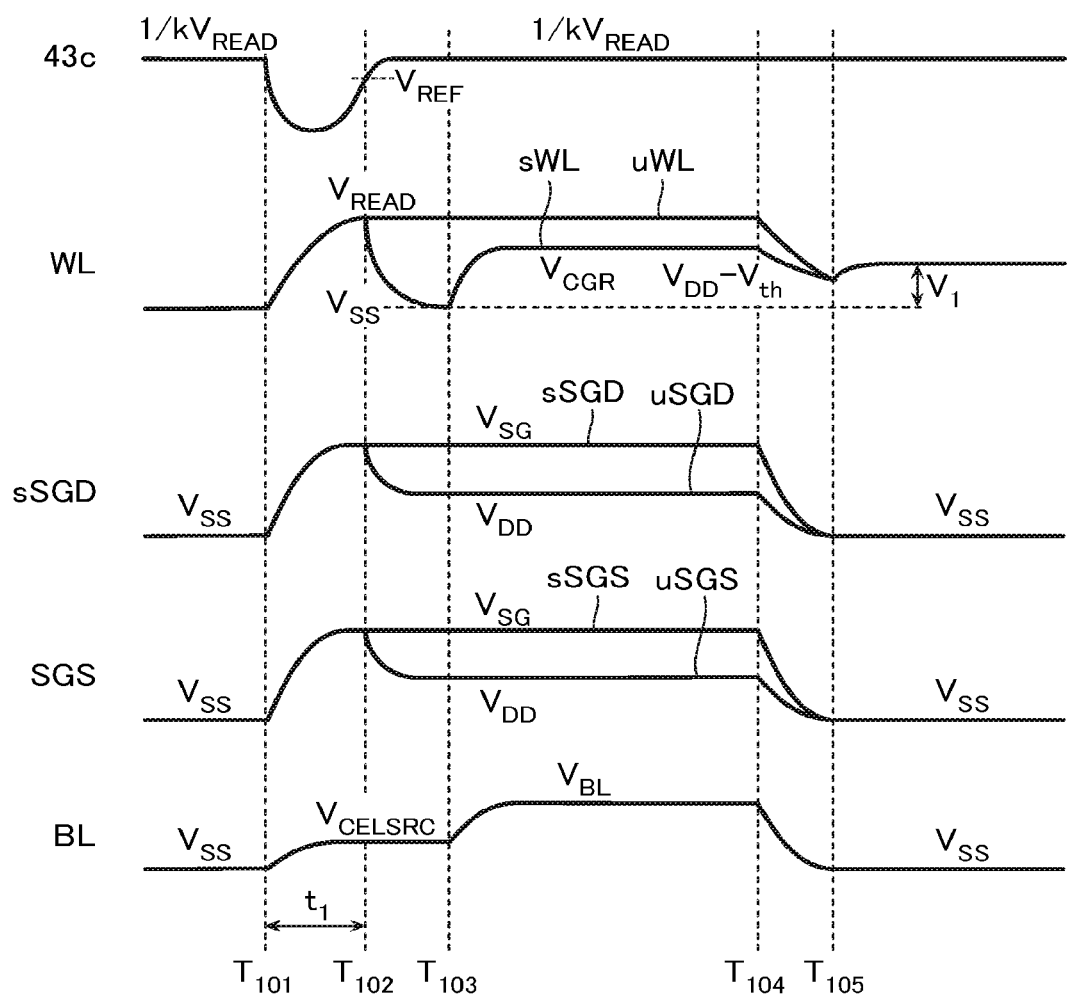
FIG. 18A is a schematic timing diagram for describing the read operation according to the first embodiment.
Figure 18B:
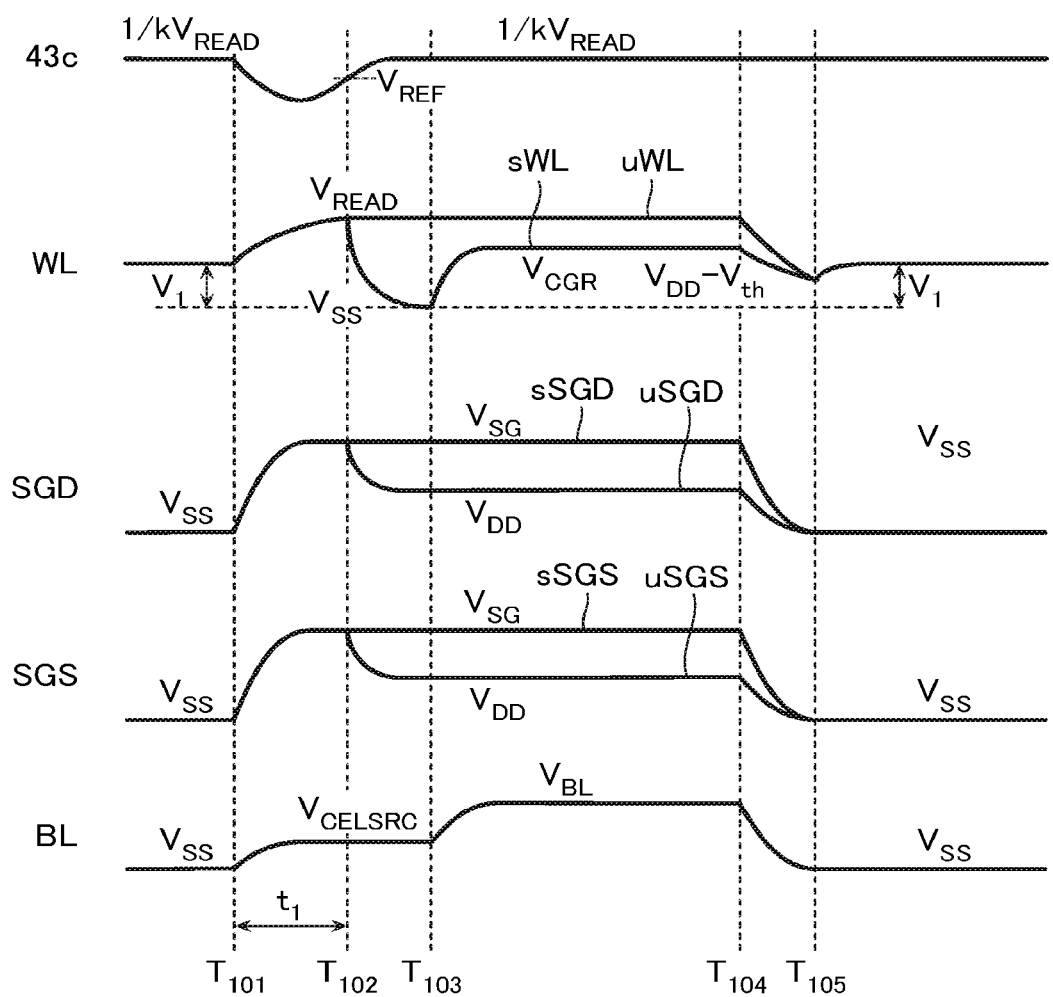
FIG. 18B is a schematic timing diagram for describing the read operation according to the first embodiment.

While the preferred length of the waiting period $t_1$ is different depending on various conditions, according to the first embodiment, as exemplified in FIG. 18A and FIG. 18B, the waiting period $t_1$ is adjustable corresponding to the various conditions.

For example, as described above, when the read operation according to the embodiment is executed, the creeping-up may occur to cause a state where the voltage of the word line WL is larger than the ground voltage $V_{SS}$. When an initial voltage of the word line WL is thus large, for example, as exemplified in FIG. 9, the waiting period $t_1$ may be relatively short. On the other hand, for example, in activating the semiconductor memory device MD, the voltage of the word line WL may be around the ground voltage $V_{SS}$. When the initial voltage of the word line WL is thus small, for example, as exemplified in FIG. 18A, the waiting period $t_1$ may be relatively long.

For example, caused by a manufacturing error or the like, a time constant (an RC time constant) of the word line WL and the like may vary to generate a difference in a step-up rate. For example, when an outer diameter of the semiconductor layer 120 is large, inner diameters of through-holes provided on the conducting layer 110 may become large to increase a resistance value of the conducting layer 110. In such a case, for example, as exemplified in FIG. 18B, an average value, the maximum value, and the like of the step-up rate (a rate at which the word line WL is charged) may decrease to make the waiting period $t_1$ relatively long. Meanwhile, when the outer diameter of the semiconductor layer 120 and the inner diameter of the through-holes provided on the conducting layer 110 are small, for example, as exemplified in FIG. 9, the average value, the maximum value, and the like of the step-up rate (the rate at which the word line WL is charged) may increase to make the waiting period $t_1$ relatively short.

For example, as in a case where four or more memory cell arrays MCA are disposed on the semiconductor substrate 100, a distance to the driver circuit DRV may be different depending on the memory cell arrays MCA. In such a case, a wiring resistance and the like in the peripheral circuit PC may be different depending on the memory cell arrays MCA to generate a difference in the step-up rate. For example, in the memory cell array MCA far from the driver circuit DRV, for example, as exemplified in FIG. 18B, the average value, the maximum value, and the like of the step-up rate (the rate at which the word line WL is charged) may decrease to make the waiting period $t_1$ relatively long. Meanwhile, in the memory cell array MCA close to the driver circuit DRV, for example, as exemplified in FIG. 9, the average value, the maximum value, and the like of the step-up rate (the rate at which the word line WL is charged) may increase to make the waiting period $t_1$ relatively short.

Second Embodiment

[Configuration]

Figure 19:
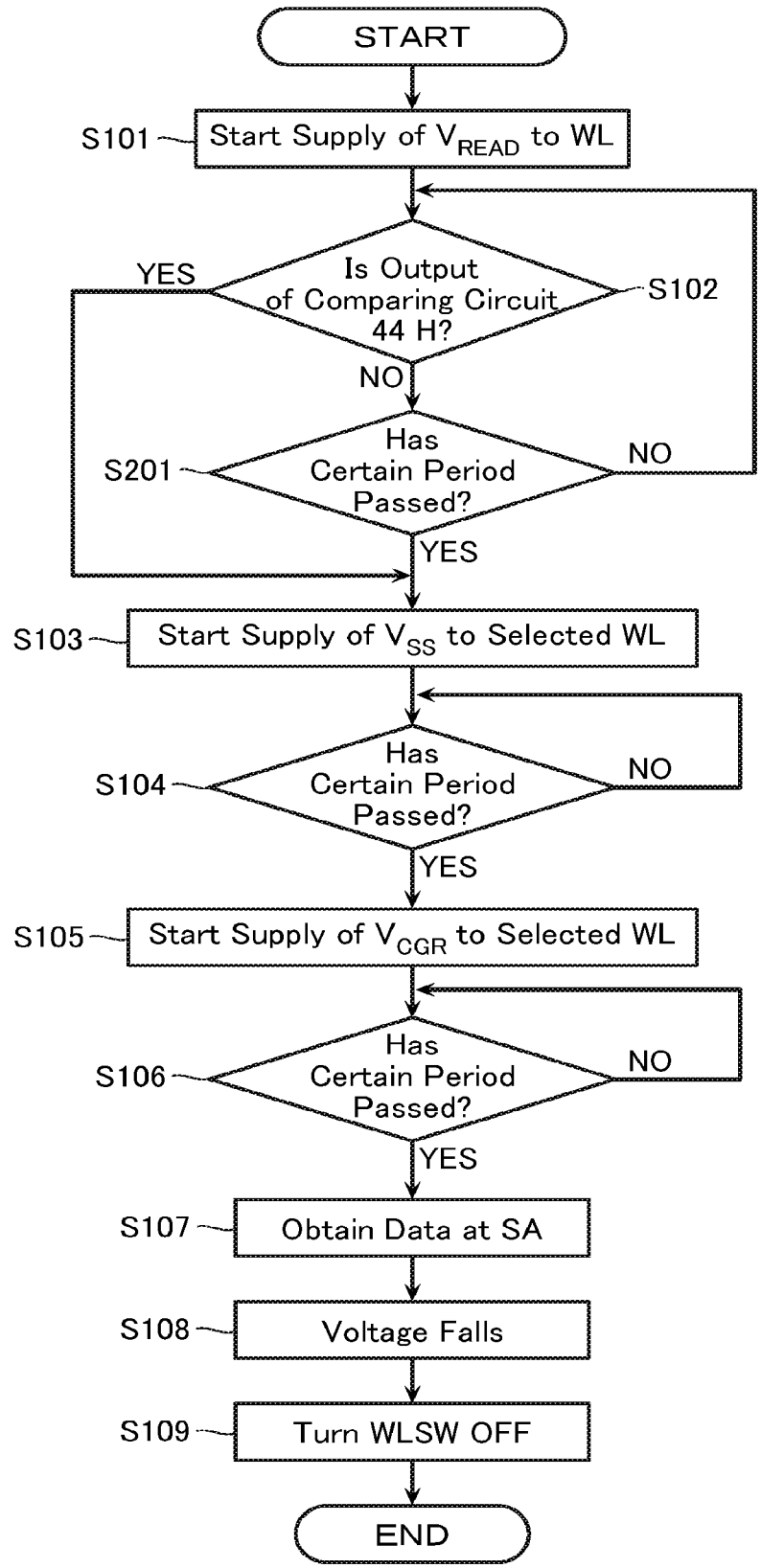
FIG. 19 is a schematic flowchart for describing the read operation according to a second embodiment.

With reference to FIG. 19, the following describes a semiconductor memory device according to a second embodiment. FIG. 19 is a schematic flowchart for describing a read operation according to the embodiment.

The semiconductor memory device according to the embodiment is configured similarly to the semiconductor memory device according to the first embodiment.

The read operation according to the embodiment is approximately similar to the read operation according to the first embodiment. However, in Step S102 of this embodiment, when the output voltage of the comparing circuit 44 (FIG. 3) is not "H", the operation proceeds to Step S201.

In Step S201, with reference to the timer (not illustrated) or the like, it is determined whether a predetermined period has passed from the execution of Step S101 or not. When the predetermined period has not passed, the operation proceeds to Step S102. When the predetermined period has passed, the operation proceeds to Step S103.

Here, for example, as in a case where a leak current has occurred on a current path from the charge pump circuit 40 to the source line SL through the word line WL, it may be thought that the voltage of the output terminal 43c of the voltage dividing circuit 43 does not become larger than the reference voltage $V_{REF}$. The method according to the embodiment can forcibly end the read operation in such a case. In such a case, for example, a signal or the like that indicates an error can be output.

Third Embodiment

Figure 20:
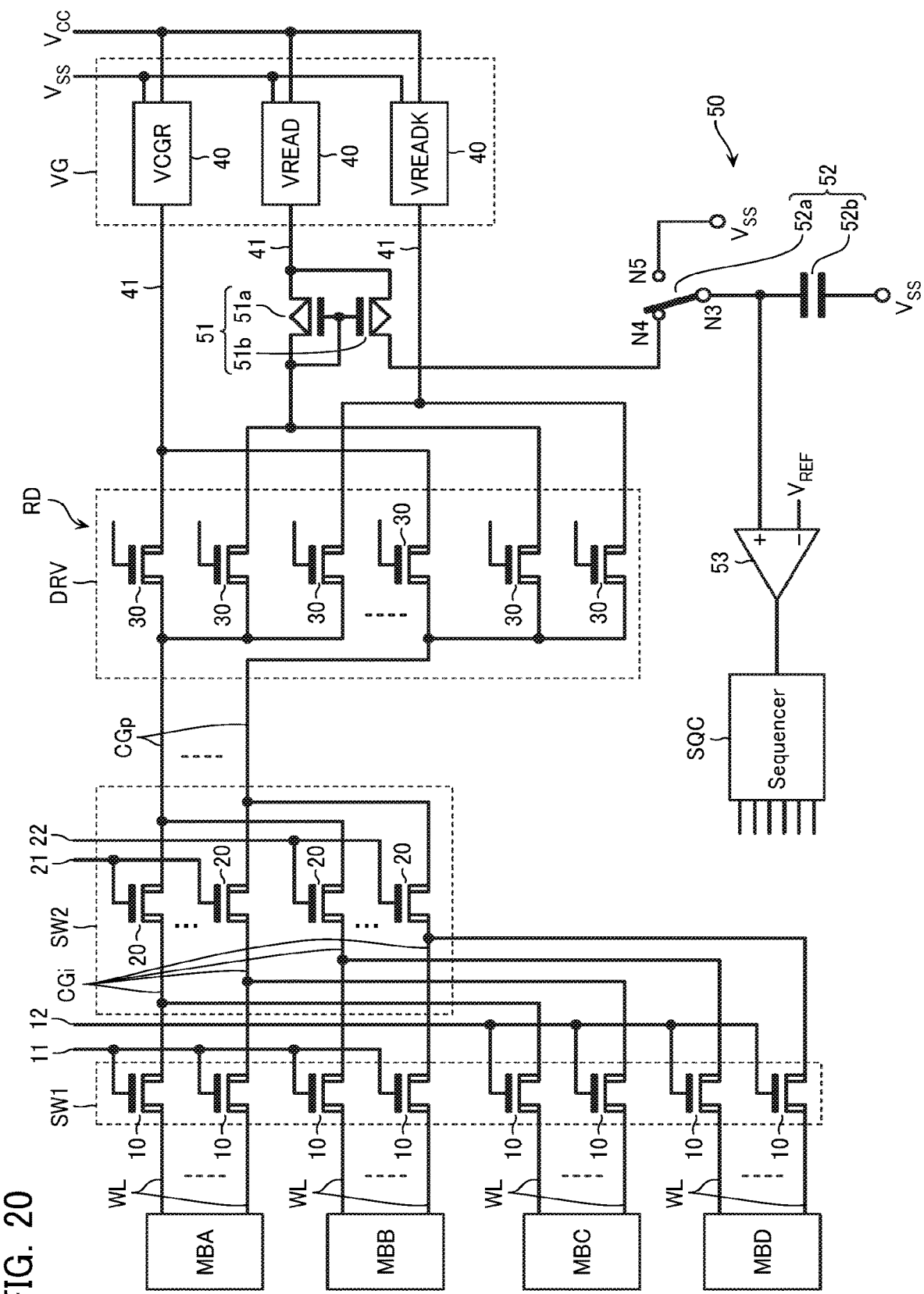
FIG. 20 is a schematic circuit diagram illustrating a configuration of a part of a semiconductor memory device according to a third embodiment.

[Configuration]
With reference to FIG. 20, the following describes a semiconductor memory device according to a third embodiment. FIG. 20 is a schematic circuit diagram illustrating a configuration of a part of the semiconductor memory device according to the embodiment.

The semiconductor memory device according to the embodiment is basically configured similarly to the semiconductor memory device MD according to the first embodiment but does not include the voltage detecting circuit 42. As illustrated in FIG. 20, the semiconductor memory device according to the embodiment includes a current detecting circuit 50.

The current detecting circuit 50 according to the embodiment includes a current mirror circuit 51 connected to at least one of the voltage supply lines 41 of the plurality of charge pump circuits 40, a sampling circuit 52 connected to the current mirror circuit 51, and a comparing circuit 53 connected to the sampling circuit 52.

The current mirror circuit 51 includes a PMOS transistor 51a connected between the voltage supply line 41 and the driver circuit DRV and a PMOS transistor 51b having a source terminal commonly connected with a source terminal of the PMOS transistor 51a and a gate terminal commonly connected with a gate terminal and a drain terminal of the PMOS transistor 51a. The current flowing through the PMOS transistor 51b may be, for example, around one tenth of the current flowing through the PMOS transistor 51a.

The sampling circuit 52 includes a switch circuit 52a that selectively connects a node N3 to a node N4 or a node N5 and a capacitor 52b connected between the node N3 and a grounding terminal ($V_{SS}$). The node N4 of the switch circuit 52a is connected to the drain terminal of the PMOS transistor 51b. The node N5 of the switch circuit 52a is connected to the grounding terminal ($V_{SS}$).

The comparing circuit 53 includes one input terminal connected to the node N3 of the switch circuit 52a. The comparing circuit 53 includes another input terminal supplied with the reference voltage $V_{REF}$. The comparing circuit 53 includes an output terminal connected to the sequencer SQC.

Figure 21:
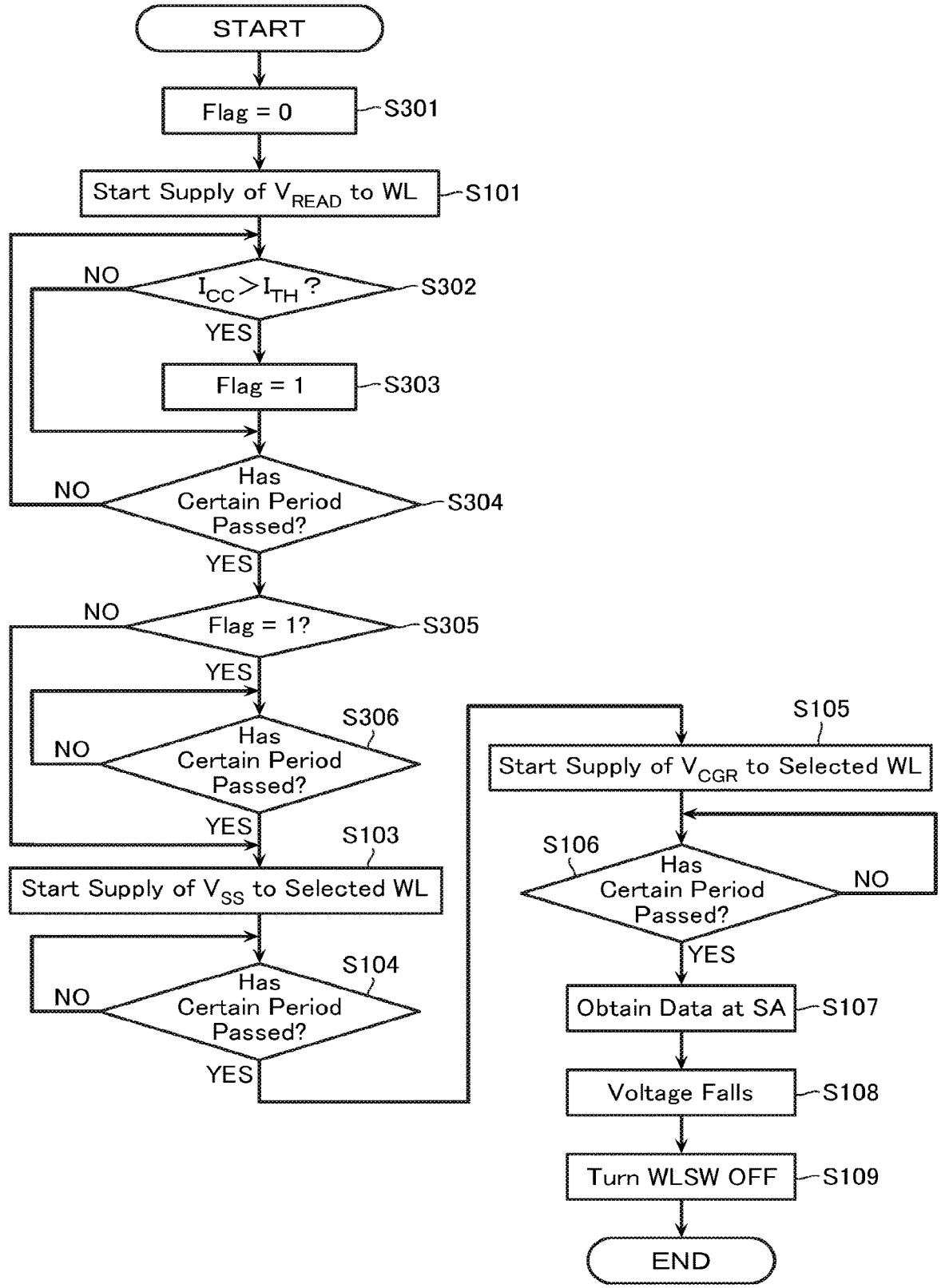
FIG. 21 is a schematic flowchart for describing a read operation according to the third embodiment.
Figure 22:
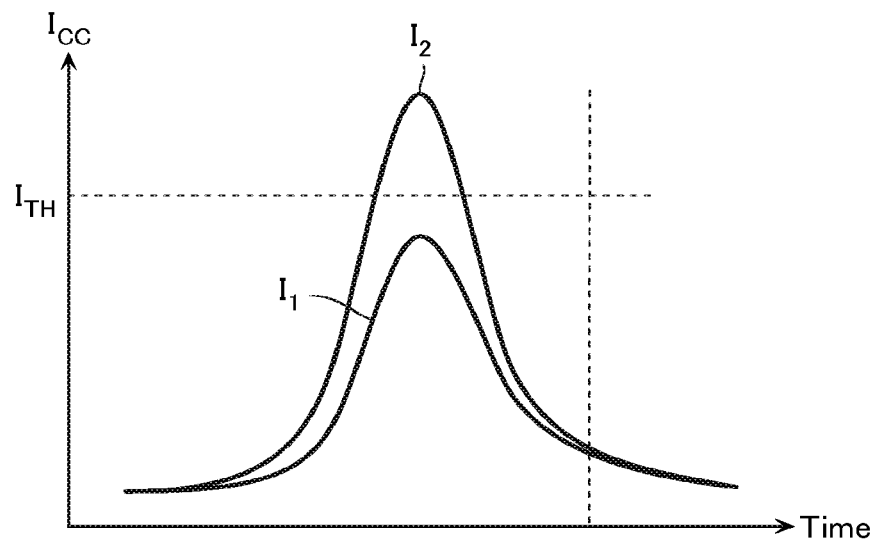
FIG. 22 is a schematic graph for describing the read operation.

[Read Operation]
With reference to FIG. 21 and FIG. 22, the following describes a read operation of the semiconductor memory device according to the embodiment. FIG. 21 is a schematic flowchart for describing the read operation of the semiconductor memory device according to the embodiment. FIG. 22 is a schematic graph for describing the read operation.

In Step S301, a flag is set at "0". The flag is latched in a register or the like.

In Step S101, an operation similar to the operation in Step S101 described with reference to FIG. 8 and the like is executed.

In Step S302, a current $I_{CC}$ of the voltage supply line 41 is detected and it is determined whether this current is larger than a predetermined threshold current $I_{TH}$ or not. For example, the node N3 of the switch circuit 52a in FIG. 20 is caused to contact the node N4 for a predetermined sampling period, and it is determined whether the voltage of the node N3 becomes larger than the reference voltage $V_{REF}$ for this period or not. When the voltage of the node N3 becomes larger than the reference voltage $V_{REF}$, the operation proceeds to Step S303. When the voltage of the node N3 does not become larger than the reference voltage $V_{REF}$, the operation proceeds to Step S304. In Step S302, afterwards, the node N3 of the switch circuit 52a is caused to contact the node N5 to discharge the electric charge of the node N3.

In Step S303, the flag is set at "1".

In Step S304, with reference to the timer (not illustrated) or the like, it is determined whether a predetermined period has passed from the execution of Step S101 or not. When the predetermined period has not passed, the operation proceeds to Step S302. When the predetermined period has passed, the operation proceeds to Step S305.

In Step S305, it is determined whether the flag is "1" or not. When the flag is "1", the operation proceeds to Step S306. When the flag is not "1", the operation proceeds to Step S103.

In Step S306, with reference to the timer (not illustrated) or the like, it is determined whether a predetermined period has passed from the execution of Step S305 or not. When the predetermined period has not passed, the operation proceeds to Step S306. When the predetermined period has passed, the operation proceeds to Step S103.

In Step S103 to Step S109, an operation similar to the operation in Step S103 to Step S109 described with reference to FIG. 8 and the like is executed.

Here, for example, as exemplified in FIG. 9, when the voltage of the word line WL has become a certain amount of magnitude by the creeping-up or the like, a current $I_1$ flowing through the voltage supply line 41 in case that the voltage of the word line WL increases from the voltage $V_1$ to the voltage $V_{READ}$ is relatively small. Meanwhile, for example, as exemplified in FIG. 18A, when the voltage of the word line WL is around the ground voltage $V_{SS}$, a current $I_2$ flowing through the voltage supply line 41 in case that the voltage of the word line WL increases from the ground voltage $V_{SS}$ to the voltage $V_{READ}$ is relatively large. Therefore, for example, as exemplified in FIG. 22, the waiting period $t_1$ from the timing $T_{101}$ to the timing $T_{102}$ can be adjusted depending on whether the maximum value of the current $I_{CC}$ flowing through the voltage supply line 41 becomes larger than the predetermined threshold current $I_{TH}$ or not. This can provide the semiconductor memory device that operates at high speed without damaging the reliability.

Depending on the condition and the like, the current detecting circuit 50 as in the embodiment may be able to more accurately detect the state of the word line WL and the like compared with the voltage detecting circuit 42 as in the first embodiment.

As described above, caused by a manufacturing error, distances among components, or the like, the step-up rate (a rate at which the word line WL is charged) of the word line WL and the like may vary. The read operation according to the third embodiment may be applied in such cases. In such cases, for example, it may be thought to make the waiting period $t_1$ relatively long when an average value, the maximum value, and the like of the step-up rate (a rate at which the word line WL is charged) of the word line WL is small. Meanwhile, it may be thought to make the waiting period $t_1$ relatively short when an average value, the maximum value, and the like of the step-up rate (a rate at which the word line WL is charged) of the word line WL is large. In such a case, for example, at the Step S305 of FIG. 21, it is determined whether the flag is "0" or not. When the flag is "0", the operation proceeds to Step S306. When the flag is not "0", the operation proceeds to Step S103.

Fourth Embodiment

Figure 23:
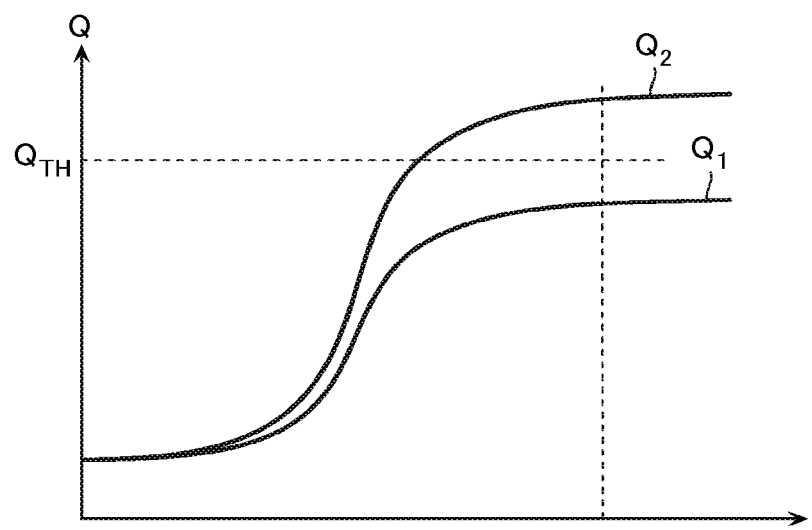
FIG. 23 is a schematic graph for describing a read operation according to a fourth embodiment.

The following describes a fourth embodiment with reference to FIG. 23. FIG. 23 is a schematic graph for describing a read operation according to the embodiment.

A semiconductor memory device according to the embodiment is configured similarly to the semiconductor memory device according to the third embodiment.

The read operation according to the embodiment is approximately similar to the read operation according to the third embodiment. However, in the embodiment, in Step S302 (FIG. 21), not the current $I_{CC}$ of the voltage supply line 41, but an amount of electric charge supplied from the voltage supply line 41 is detected, and it is determined whether this amount of electric charge is larger than a predetermined threshold or not. For example, the node N3 of the switch circuit 52a in FIG. 20 is caused to contact the node N4, and it is determined whether the voltage of the node N3 becomes larger than the reference voltage $V_{REF}$ or not. When the voltage of the node N3 becomes larger than the reference voltage $V_{REF}$, the operation proceeds to Step S303. When the voltage of the node N3 does not become larger than the reference voltage $V_{REF}$, the operation proceeds to Step S304. In this embodiment, different from the third embodiment, until the flag is set at "1", or until Step S304 ends, the node N3 of the switch circuit 52a is continued to be in contact with the node N4.

As described above, caused by a manufacturing error, distances among components, or the like, the step-up rate (a rate at which the word line WL is charged) of the word line WL and the like may vary. The read operation according to the fourth embodiment may be applied in such cases.

Other Embodiments

In the above description, an example that adjusts the waiting period $t_1$ during the timings $T_{101}$ to $T_{102}$ of the read operation has been described. However, another waiting period can be adjusted using the method as described above.

In the above description, an example that adjusts the waiting period of the predetermined timing in an ordinary read operation has been described. However, the waiting period in another operation can be adjusted using the method as described above.

For example, the write operation includes a program operation and a write verify operation.

Figure 24:
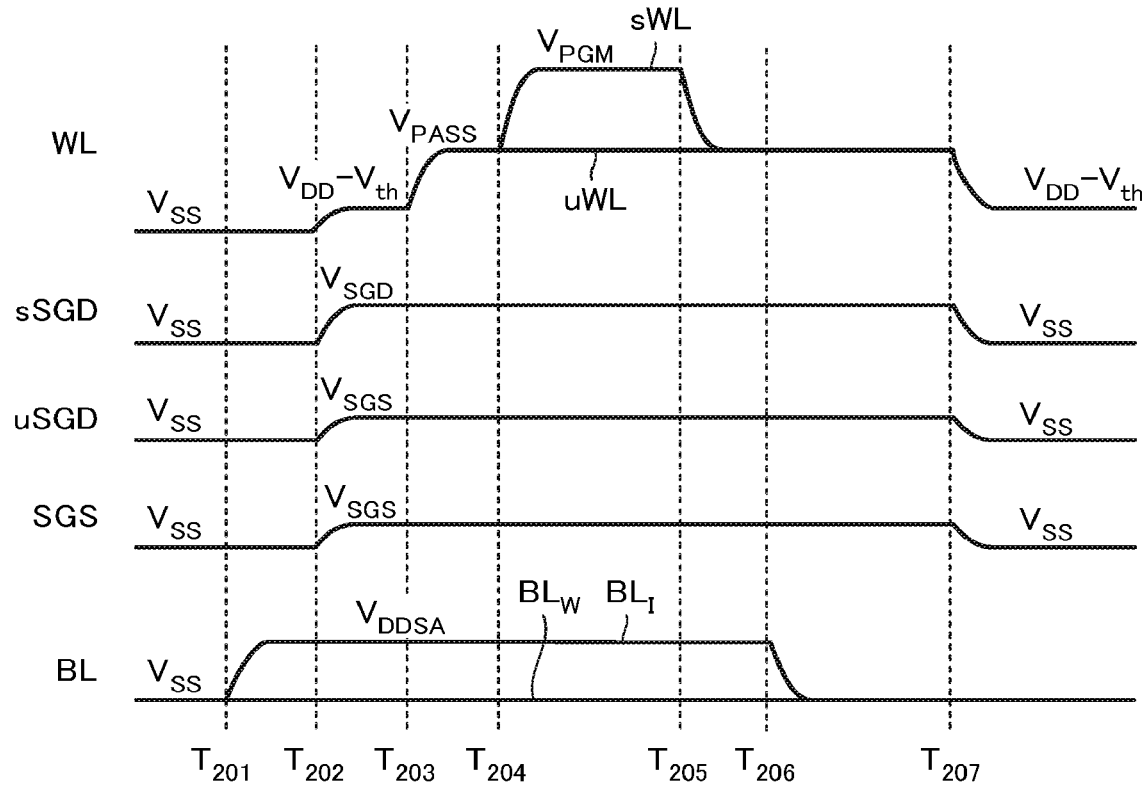
FIG. 24 is a schematic graph for describing a write operation according to another embodiment.

In the program operation, for example, as illustrated in FIG. 24, at a timing $T_{201}$, a bit line $BL_W$ connected to the memory cell MC whose threshold voltage is adjusted is supplied with the ground voltage $V_{SS}$, and a bit line $BL_I$ connected to the memory cell MC whose threshold voltage is not adjusted is supplied with an inhibit voltage $V_{DDSA}$. The inhibit voltage $V_{DDSA}$ is larger than the ground voltage $V_{SS}$.

In the program operation, for example, at a timing $T_{202}$, the selected drain select line sSGD is supplied with a voltage $V_{SGD}$, the non-selected drain select line uSGD and the source select line SGS are supplied with a voltage $V_{SGS}$, and the word line WL is supplied with a voltage $V_{DD}$-$V_{th}$. The voltage $V_{SGD}$ is, for example, smaller than the voltage $V_{SG}$ in FIG. 10 and has a magnitude to the extent that the drain select transistor STD corresponding to the bit line $BL_W$ turns ON and the drain select transistor STD corresponding to the bit line $BL_I$ turns OFF.

In the program operation, for example, at a timing $T_{203}$, the word line WL is supplied with a write pass voltage $V_{PASS}$. The write pass voltage $V_{PASS}$ may be, for example, larger than the read pass voltage $V_{READ}$ in FIG. 7.

In the program operation, at a timing $T_{204}$, the selected word line sWL is supplied with a program voltage $V_{PGM}$. The program voltage $V_{PGM}$ is larger than the write pass voltage $V_{PASS}$. This accumulates the electrons in the electric charge accumulating film 132 (FIG. 7) of a desired memory cell MC to increase the threshold voltage of the memory cell MC.

Afterwards, for example, at a timing $T_{205}$, the voltage of the selected word line sWL falls to the write pass voltage $V_{PASS}$. For example, at a timing $T_{206}$, the voltage of the bit line $BL_I$ falls to the ground voltage $V_{SS}$. For example, at a timing $T_{207}$, the voltage of the word line WL falls to $V_{DD}$-$V_{th}$, and the voltage of the select gate line (SGD, SGS) falls to the ground voltage $V_{SS}$.

Figure 25:
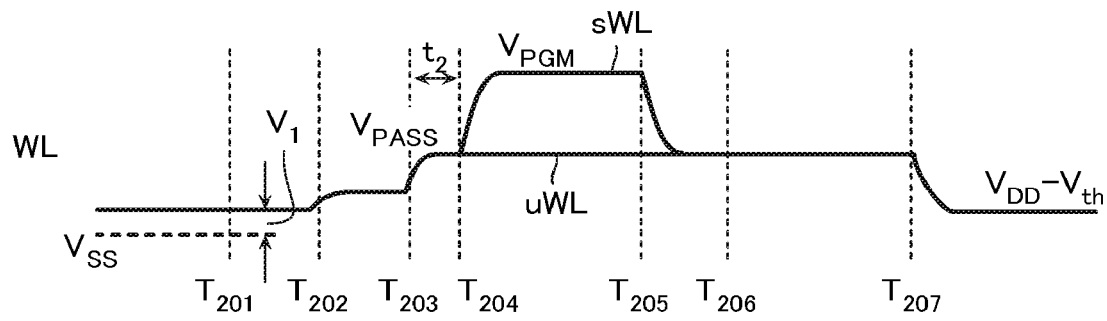
FIG. 25 is a schematic graph for describing a write operation according to another embodiment.
Figure 26:
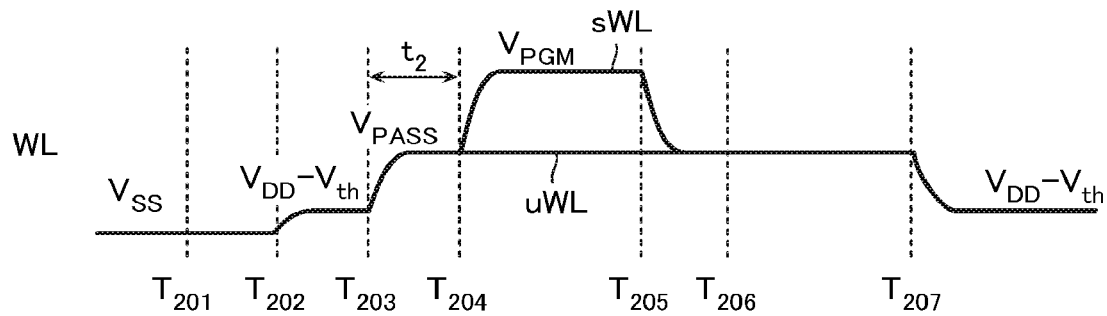
FIG. 26 is a schematic graph for describing a write operation according to another embodiment.

Here, for example, as exemplified in FIG. 25, the initial voltage of the word line WL in the program operation may have become relatively large by the above-described creeping-up or the like. Meanwhile, as exemplified in FIG. 26, the initial voltage of the word line WL in the program operation may have become relatively small such as the ground voltage $V_{SS}$. In such a case, as exemplified in FIG. 25 and FIG. 26, with a method similar to those in the first embodiment to the fourth embodiment, a waiting period $t_2$ between the timing $T_{203}$ and the timing $T_{204}$ during which the word line WL is supplied with the write pass voltage $V_{PASS}$ may be adjusted.

Figure 27:
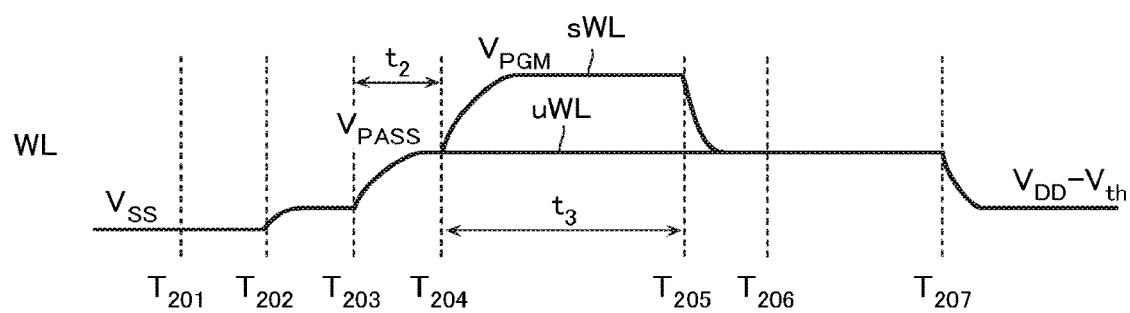
FIG. 27 is a schematic graph for describing a write operation according to another embodiment.
Figure 28:
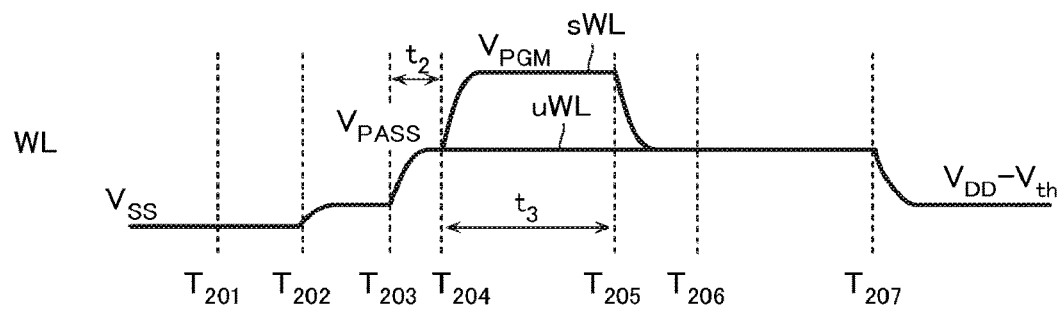
FIG. 28 is a schematic graph for describing a write operation according to another embodiment.

For example, as exemplified in FIG. 27 and FIG. 28, with a difference in the RC time constant or the like, the voltage of the word line WL may relatively quickly rise or may relatively slowly rise. In such a case, with a method similar to those in the first embodiment to the fourth embodiment, the waiting period $t_2$ between the timing $T_{203}$ and the timing $T_{204}$ may be adjusted, or a waiting period $t_3$ between the timing $T_{204}$ and the timing $T_{205}$ may be adjusted.

The write verify operation is executed after the execution of the program operation. The write verify operation is an operation to confirm whether the threshold voltage of the memory cell MC has increased to a desired magnitude by the program operation or not. The write verify operation is executed approximately similarly to the ordinary read operation. Also in such a case, similarly to the ordinary read operation, the waiting period $t_1$ can be adjusted.

Additionally, the waiting period in various operations such as an erase verify operation executed in the erase operation can be adjusted with a method similar to those in the first embodiment to the fourth embodiment.

In this description, when referring to "the read operation", it may mean not only the ordinary read operation, but also one including the write verify operation, the erase verify operation, and the like.

In the above description, an example that detects the rising of the voltage, the current, and the like has been described. However, for example, the falling of the voltage, the current, and the like can be also detected. In this case, for example, it is only necessary to set the reference voltage $V_{REF}$ higher than a target value and detect whether the output signal of the comparing circuit 44 or 53 has become "L" or not, not whether the output signal of the comparing circuit 44 or 53 has become "H" or not.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory transistor;
   a first wiring connected to a gate electrode of the memory transistor; and
   a control device that executes a read operation to read data of the memory transistor and a write operation to write data in the memory transistor, wherein
   in the read operation or the write operation, the control device:
   increases a voltage of the first wiring to a first voltage from a first timing to a second timing; and
   adjusts a length from the first timing to the second timing corresponding to at least one of a voltage of the first wiring, a current of the first wiring, and an amount of charge flowed through the first wiring, and wherein
   in the read operation, the control device;
   increases the voltage of the first wiring to the first voltage from the first timing to the second timing;
   decreases the voltage of the first wiring to a second voltage from the second timing to a third timing, and
   when a length from the first timing to the second timing is defined as a first length in case that the voltage of the first wiring at the first timing is a first initial voltage, and
   a length from the first timing to the second timing is defined as a second length in case that the voltage of the first wiring at the first timing is a second initial voltage smaller than the first initial voltage and substantially equal to a ground voltage,
   the control device sets the second length larger than the first length.

2. The semiconductor memory device according to claim 1, wherein
   the read operation is a write verify operation executed in the write operation or an erase verify operation executed in an erase operation.

3. The semiconductor memory device according to claim 1, wherein
   in the read operation, the control device:
   increases the voltage of the first wiring to the first voltage from the first timing to the second timing;
   decreases the voltage of the first wiring to a second voltage from the second timing to the third timing, and
   when a length from the first timing to the second timing is defined as a first length in case that a maximum value of a rate at which the voltage of the first wiring increases from the first timing to the second timing is a first rate, and
   a length from the first timing to the second timing is defined as a second length in case that a maximum value of a rate at which the voltage of the first wiring increases from the first timing to the second timing is a second rate smaller than the first rate,
   the control device sets the second length larger than the first length.

4. The semiconductor memory device according to claim 1, wherein
   in the write operation, the control device:
   increases a voltage of the first wiring to the first voltage from the first timing to the second timing,
   increases the voltage of the first wiring to a third voltage from the second timing to the third timing, and
   when a length from the first timing to the second timing is defined as a first length in case that the voltage of the first wiring at the first timing is a first initial voltage, and
   a length from the first timing to the second timing is defined as a second length in case that the voltage of the first wiring at the first timing is a second initial voltage smaller than the first initial voltage,
   the control device sets the second length larger than the first length.

5. The semiconductor memory device according to claim 1, wherein
   in the write operation, the control device:
   increases a voltage of the first wiring to the first voltage from the first timing to the second timing, and
   when a length from the first timing to the second timing is defined as a first length in case that a maximum value of a rate at which the voltage of the first wiring increases from the first timing to the second timing is a first rate, and
   a length from the first timing to the second timing is defined as a second length in case that a maximum value of a rate at which the voltage of the first wiring increases from the first timing to the second timing is a second rate smaller than the first rate,
   the control device sets the second length larger than the first length.

6. The semiconductor memory device according to claim 5, wherein
   in the write operation, the control device:
   increases the voltage of the first wiring to a third voltage from the second timing to the third timing, and
   when a length from the second timing to the third timing is defined as a third length in case that a maximum value of a rate at which the voltage of the first wiring increases from the second timing to the third timing is a third rate, and
   a length from the second timing to the third timing is defined as a fourth length in case that a maximum value of a rate at which the voltage of the first wiring increases from the second timing to the third timing is a fourth rate smaller than the third rate,
   the control device sets the fourth length larger than the second length.

7. The semiconductor memory device according to claim 1, the semiconductor memory device comprising:
   a peripheral circuit connected to the first wiring; and
   a pad electrode connected to the peripheral circuit, the peripheral circuit being configured to be supplied with a power supply voltage through the pad electrode, wherein
   the peripheral circuit includes:

a voltage output circuit that includes an output terminal connected to the first wiring and is configured to output a voltage larger than the power supply voltage to the output terminal;

a voltage dividing circuit connected to the output terminal of the voltage output circuit; and a comparing circuit connected to the voltage dividing circuit.

8. The semiconductor memory device according to claim 1, the semiconductor memory device comprising:

a peripheral circuit connected to the first wiring; and a pad electrode connected to the peripheral circuit, the peripheral circuit being configured to be supplied with a power supply voltage through the pad electrode, wherein the peripheral circuit includes:

a voltage output circuit that includes an output terminal connected to the first wiring and is configured to output a voltage larger than the power supply voltage to the output terminal;

a current mirror circuit connected to the output terminal of the voltage output circuit;

a first switch circuit connected to the current mirror circuit; and a comparing circuit connected to the first switch circuit.

9. The semiconductor memory device according to claim 7, the semiconductor memory device comprising:

a substrate that has a first region and a second region;

a plurality of memory blocks disposed on the first region of the substrate and arranged in a first direction, the plurality of memory blocks including the memory transistor and the first wiring;

a second switch circuit disposed on the first region of the substrate and aligned with the plurality of memory blocks in a second direction intersecting with the first direction;

the voltage output circuit disposed on the second region of the substrate and connected to the plurality of memory blocks via the second switch circuit; and the comparing circuit disposed on the second region of the substrate.

10. The semiconductor memory device according to claim 8, the semiconductor memory device comprising:

a substrate that has a first region and a second region;

a plurality of memory blocks disposed on the first region of the substrate and arranged in a first direction, the plurality of memory blocks including the memory transistor and the first wiring;

a second switch circuit disposed on the first region of the substrate and aligned with the plurality of memory blocks in a second direction intersecting with the first direction;

the voltage output circuit disposed on the second region of the substrate and connected to the plurality of memory blocks via the second switch circuit; and the comparing circuit disposed on the second region of the substrate.

11. A method of controlling a semiconductor memory device, the semiconductor memory device comprising:

a memory transistor;

a first wiring connected to a gate electrode of the memory transistor; and a control device that executes a read operation to read data of the memory transistor and a write operation to write data in the memory transistor, wherein in the read operation or the write operation, the control device:

increases a voltage of the first wiring to a first voltage from a first timing to a second timing; and adjusts a length from the first timing to the second timing corresponding to at least one of a voltage of the first wiring, a current of the first wiring, and an amount of charge flowed through the first wiring, wherein in the read operation, the control device:

increases the voltage of the first wiring to the first voltage from the first timing to the second timing;

decreases the voltage of the first wiring to a second voltage from the second timing to a third timing, and when a length from the first timing to the second timing is defined as a first length in case that the voltage of the first wiring at the first timing is a first initial voltage, and a length from the first timing to the second timing is defined as a second length in case that the voltage of the first wiring at the first timing is a second initial voltage smaller than the first initial voltage and substantially equal to aground voltage, the control device sets the second length larger than the first length.

12. The method of controlling the semiconductor memory device according to claim 11, wherein the read operation is a write verify operation executed in the write operation or an erase verify operation executed in an erase operation.

13. The method of controlling the semiconductor memory device according to claim 11, wherein in the read operation, the control device:

increases the voltage of the first wiring to the first voltage from the first timing to the second timing;

decreases the voltage of the first wiring to a second voltage from the second timing to the third timing, and when a length from the first timing to the second timing is defined as a first length in case that a maximum value of a rate at which the voltage of the first wiring increases from the first timing to the second timing is a first rate, and a length from the first timing to the second timing is defined as a second length in case that a maximum value of a rate at which the voltage of the first wiring increases from the first timing to the second timing is a second rate smaller than the first rate, the control device sets the second length larger than the first length.

14. The method of controlling the semiconductor memory device according to claim 11, wherein in the write operation, the control device:

increases a voltage of the first wiring to the first voltage from the first timing to the second timing, increases the voltage of the first wiring to a third voltage from the second timing to the third timing, and when a length from the first timing to the second timing is defined as a first length in case that the voltage of the first wiring at the first timing is a first initial voltage, and a length from the first timing to the second timing is defined as a second length in case that the voltage of the first wiring at the first timing is a second initial voltage smaller than the first initial voltage, the control device sets the second length larger than the first length.

15. The method of controlling the semiconductor memory device according to claim 11, wherein in the write operation, the control device:
increases a voltage of the first wiring to the first voltage from the first timing to the second timing, and
when a length from the first timing to the second timing is defined as a first length in case that a maximum value of a rate at which the voltage of the first wiring increases from the first timing to the second timing is a first rate, and
a length from the first timing to the second timing is defined as a second length in case that a maximum value of a rate at which the voltage of the first wiring increases from the first timing to the second timing is a second rate smaller than the first rate,
the control device sets the second length larger than the first length.

16. The method of controlling the semiconductor memory device according to claim 15, wherein
in the write operation, the control device:
increases the voltage of the first wiring to a third voltage from the second timing to the third timing, and
when a length from the second timing to the third timing is defined as a third length in case that a maximum value of a rate at which the voltage of the first wiring increases from the second timing to the third timing is a third rate, and
a length from the second timing to the third timing is defined as a fourth length in case that a maximum value of a rate at which the voltage of the first wiring increases from the second timing to the third timing is a fourth rate smaller than the third rate,
the control device sets the fourth length larger than the second length.

17. A semiconductor memory device comprising:
a memory transistor;
a first wiring connected to a gate electrode of the memory transistor; and
a control device that executes a read operation to read data of the memory transistor and a write operation to write data in the memory transistor, wherein
in the read operation or the write operation, the control device:
increases a voltage of the first wiring to a first voltage from a first timing to a second timing; and
adjusts a length from the first timing to the second timing corresponding to at least one of a voltage of the first wiring, a current of the first wiring, and an amount of charge flowed through the first wiring, wherein
in the read operation, the control device:
increases the voltage of the first wiring to the first voltage from the first timing to the second timing;
decreases the voltage of the first wiring to a second voltage from the second timing to a third timing, and
when a length from the first timing to the second timing is defined as a first length in case that the voltage of the first wiring at the first timing is a first initial voltage, and
a length from the first timing to the second timing is defined as a second length in case that the voltage of the first wiring at the first timing is a second initial voltage smaller than the first initial voltage,
the control device sets the second length larger than the first length, and
when the control device starts increasing the voltage of the first wiring to the first voltage, the first initial voltage and the second initial voltage are different from each other.

18. The semiconductor memory device according to claim 17, wherein
the read operation is a write verify operation executed in the write operation or an erase verify operation executed in an erase operation.

19. The semiconductor memory device according to claim 17, wherein
in the read operation, the control device:
increases the voltage of the first wiring to the first voltage from the first timing to the second timing;
decreases the voltage of the first wiring to a second voltage from the second timing to the third timing, and
when a length from the first timing to the second timing is defined as a first length in case that a maximum value of a rate at which the voltage of the first wiring increases from the first timing to the second timing is a first rate, and
a length from the first timing to the second timing is defined as a second length in case that a maximum value of a rate at which the voltage of the first wiring increases from the first timing to the second timing is a second rate smaller than the first rate,
the control device sets the second length larger than the first length.

20. The semiconductor memory device according to claim 17, wherein
in the write operation, the control device:
increases a voltage of the first wiring to the first voltage from the first timing to the second timing,
increases the voltage of the first wiring to a third voltage from the second timing to the third timing, and
when a length from the first timing to the second timing is defined as a first length in case that the voltage of the first wiring at the first timing is a first initial voltage, and
a length from the first timing to the second timing is defined as a second length in case that the voltage of the first wiring at the first timing is a second initial voltage smaller than the first initial voltage,
the control device sets the second length larger than the first length.

21. The semiconductor memory device according to claim 17, wherein
in the write operation, the control device:
increases a voltage of the first wiring to the first voltage from the first timing to the second timing, and
when a length from the first timing to the second timing is defined as a first length in case that a maximum value of a rate at which the voltage of the first wiring increases from the first timing to the second timing is a first rate, and
a length from the first timing to the second timing is defined as a second length in case that a maximum value of a rate at which the voltage of the first wiring increases from the first timing to the second timing is a second rate smaller than the first rate,
the control device sets the second length larger than the first length.

* * * * *